United States Patent
Heo et al.

(10) Patent No.: US 9,842,960 B2
(45) Date of Patent: Dec. 12, 2017

(54) METHOD OF MANUFACTURING NANOSTRUCTURE SEMICONDUCTOR LIGHT-EMITTING DEVICE

(71) Applicant: Samsung Electronics Co., Ltd., Suwon-si, Gyeonggi-do (KR)

(72) Inventors: Jae Hyeok Heo, Suwon-si (KR); Jin Sub Lee, Suwon-si (KR); Young Jin Choi, Seoul (KR); Hyun Seong Kum, Hwaseong-si (KR); Ji Hye Yeon, Cheongju-si (KR); Dae Myung Chun, Hwaseong-si (KR); Jung Sub Kim, Hwaseong-si (KR); Han Kyu Seong, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 68 days.

(21) Appl. No.: 14/867,659

(22) Filed: Sep. 28, 2015

(65) Prior Publication Data
US 2016/0099376 A1    Apr. 7, 2016

(30) Foreign Application Priority Data
Oct. 1, 2014   (KR) ........................ 10-2014-0132545

(51) Int. Cl.
| | |
|---|---|
| *H01L 33/00* | (2010.01) |
| *H01L 33/20* | (2010.01) |
| *H01L 33/06* | (2010.01) |
| *H01L 33/08* | (2010.01) |

(Continued)

(52) U.S. Cl.
CPC ............ *H01L 33/005* (2013.01); *H01L 33/06* (2013.01); *H01L 33/08* (2013.01); *H01L 33/145* (2013.01); *H01L 33/24* (2013.01)

(58) Field of Classification Search
CPC ....... H01L 33/005; H01L 33/24; H01L 33/08; H01L 33/06; H01L 33/145
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| JP | 2011-119612 A | 6/2011 |
| KR | 10-2012-0028104 A | 3/2012 |

(Continued)

*Primary Examiner* — Seahvosh Nikmanesh
(74) *Attorney, Agent, or Firm* — Harness, Dickey & Pierce, PLC

(57) ABSTRACT

According to an example embodiment, a method of manufacturing a nanostructure semiconductor light-emitting device includes forming nanocores of a first-conductivity type nitride semiconductor material on a base layer to be spaced apart from each other, and forming a multilayer shell including an active layer and a second-conductivity type nitride semiconductor layers on surfaces of each of the nanocores. At least a portion the multilayer shell is formed by controlling at least one process parameter of a flux of source gas, a flow rate of source gas, a chamber pressure, a growth temperature, and a growth rate so as to have a higher film thickness uniformity.

19 Claims, 27 Drawing Sheets

(51) Int. Cl.
   *H01L 33/14*   (2010.01)
   *H01L 33/24*   (2010.01)

(56) References Cited

U.S. PATENT DOCUMENTS

| | | | |
|---|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,455,284 B2 | 6/2013 | Seong et al. |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,406,839 B2 * | 8/2016 | Kim ............... H01L 33/06 |
| 2009/0169828 A1 | 7/2009 | Hersee et al. |
| 2012/0061641 A1 | 3/2012 | Seong et al. |
| 2012/0205692 A1 | 8/2012 | Tan et al. |
| 2013/0015477 A1 | 1/2013 | Kim et al. |
| 2013/0313514 A1 | 11/2013 | Hwang et al. |
| 2016/0013362 A1 | 1/2016 | Heo et al. |

FOREIGN PATENT DOCUMENTS

| | | |
|---|---|---|
| KR | 10-2012-0052651 A | 5/2012 |
| KR | 10-2012-0058137 A | 6/2012 |
| KR | 10-2012-0079310 A | 7/2012 |
| KR | 10-2013-0023939 A | 3/2013 |
| KR | 10-1251811 B1 | 4/2013 |
| KR | 10-2013-0107763 A | 10/2013 |
| KR | 10-1335945 B1 | 12/2013 |
| KR | 2016-0008028 A | 1/2016 |

* cited by examiner

X1-X1'

METHOD OF MANUFACTURING NANOSTRUCTURE SEMICONDUCTOR LIGHT-EMITTING DEVICE

CROSS-REFERENCE TO RELATED APPLICATION

This application claims priority under 35 U.S.C. §119 to Korean Patent Application No. 10-2014-0132545 filed on Oct. 1, 2014, with the Korean Intellectual Property Office, the entire disclosure of which is incorporated herein by reference.

BACKGROUND

The present disclosure relates to a method of manufacturing a nanostructure semiconductor light-emitting device.

Recently, semiconductor light-emitting devices provided with nanostructures have been developed as a new type of semiconductor light-emitting device technology. In semiconductor light-emitting devices employing nanostructures (hereinafter, referred to as 'nanostructure semiconductor light-emitting devices'), crystallinity may be significantly improved and degradations in performance due to polarization may be reduced or prevented, since active layers are obtained from a nonpolar surface or a semipolar surface. In addition, since light is emitted through a relatively large surface area, light extraction efficiency may be significantly improved. However, thin-film layers may not be grown to have a uniform thickness in a height direction of nanocores. This may causes degradations of optical and/or electrical characteristics.

SUMMARY

An aspect of the present disclosure relates to a nanostructure semiconductor light-emitting device having a uniform film thickness in a height direction, and a method of manufacturing the nanostructure semiconductor light-emitting device.

According to an example embodiment, a method of manufacturing a nanostructure semiconductor light-emitting device includes providing a base layer formed of a first-conductivity type nitride semiconductor material, forming nanocores of a first-conductivity type nitride semiconductor material on the base layer spaced apart from each other, and forming multilayer shell including an active layer and a second-conductivity type nitride semiconductor layer on surfaces of each of the nanocores. At least a portion the multilayer shell is formed by controlling at least one process parameter of a flux of a source gas, a flow rate of the source gas, a chamber pressure, a growth temperature, and a growth rate so as to have a film thickness uniformity of 80% or more. When a minimum thickness and a maximum thickness of a film grown on side surfaces of each of the nanocores are respectively represented by $t_a$ (nm) and $t_b$ (nm), the film thickness uniformity (%) is defined as $(t_a/t_b)\times100$.

When a height of each of the nanocores and a pitch between the nanocores are represented by H (μm) and P (μm), respectively, $H^2/P\geq3.36$ may be satisfied.

When a height of each of the nanocores and a pitch between the nanocores are represented by H (μm) and P (μm), respectively, $H^2/P\geq2.35$ may be satisfied and the film thickness uniformity may be 90% or more. In a specific example, the controlling of at least one process parameter may implement a film thickness uniformity of 95% or more.

Peak wavelength of light emitted from the active layer may have a variation of 3 nm or less.

The active layer may include quantum wells and quantum barriers alternately stacked on the surfaces of each of the nanocores, and the controlling of at least one process parameter may include controlling the growth temperature to be 1000° C. or more during growth of the quantum barriers.

The controlling of at least one process parameter may include controlling a flux of $NH_3$ to be 18000 sccm or more during growth of the active layer.

The active layers may include quantum wells and quantum barriers alternately stacked on the surfaces of each of the nanocores, and the controlling of at least one process parameter may include controlling the growth rate to be 0.006 nm/sec or less during growth of the quantum wells.

The second-conductivity type nitride semiconductor layers may include an Al-containing electron-blocking layer on the active layer and a p-type contact layer on the electron blocking layer.

In example embodiments, the controlling of at least one process parameter may include controlling at least one process factor during growth of the Al-containing electron-blocking layer.

The Al-containing electron-blocking layer may have a structure in which an Al-containing nitride layer and an Al-free nitride layer are alternately stacked a plurality of times.

According to an example embodiment, a method of manufacturing a nanostructure semiconductor light-emitting device includes providing a base layer formed of a first-conductivity type nitride semiconductor material, forming nanocores of a first-conductivity type nitride semiconductor material on the base layer spaced apart from each other, and forming multilayer shell including an active layer and a second-conductivity type nitride semiconductor layer on surfaces of each of the nanocores. The nanocores are divided into two or more groups having at least one difference in pitches and surface areas of the nanocores. The active layers of each group emit light having a different wavelength. At least a portion of the multilayer shell is formed by controlling at least one process parameter of a flux of a source gas, a flow rate of the source gas, a chamber pressure, a growth temperature, and a growth rate so as to have a film thickness uniformity of 80% or more. When a minimum thickness and a maximum thickness of a film grown on side surfaces of each of the nanocores are respectively represented as $t_a$ (nm) and $t_b$ (nm), the film thickness uniformity (%) is defined as $(t_a/t_b)\times100$.

The controlling of at least one process parameter may include controlling the process parameter such that a group emitting light having the longest wavelength maintains a film thickness uniformity of 80% or more.

When a height of each of the nanocores and a pitch between the nanocores are respectively represented by H (μm) and P (μm) in the group emitting light having the longest wavelength, $H^2/P\geq3.36$ may be satisfied.

The two or more groups may include first, second and third groups, and the first, second and third active layers respectively belonging to the first to third groups emit different colors of light, which are combined to provide white light.

In example embodiments, the first active layer has an emission wavelength of about 430 nm to about 480 nm, the second active layer has an emission wavelength of about 480 nm to about 540 nm, and the third active layer has an emission wavelength of about 540 nm to about 605 nm.

According to an example embodiment, a nanostructure semiconductor light-emitting device includes a base layer formed of a first conductivity-type nitride semiconductor material, and a plurality of light-emitting nanostructures. The plurality of light-emitting nanostructures include nanocores disposed to be spaced apart from each other on the base layer and formed of a first conductivity-type nitride semiconductor material, active layers disposed on side surfaces of the nanocores, and second conductivity-type semiconductor layers disposed on the active layer and having Al-containing electron-blocking layers. The plurality of light-emitting nanostructures are divided into two or more groups. At least one of surface areas of the nanocores and pitches between the nanocores are different in different groups. When a height of the nanocores and a pitch between the nanocores are represented by $H_n$ (μm) and $P_n$ (μm), respectively, $H_n^2/P_n \geq 2.35$ may be satisfied. Here, n represents a natural number of 1 or more and a serial number of each group. At least one of the active layers and the electron-blocking layers has a film thickness uniformity of 90% or more. When a minimum thickness and a maximum thickness of films grown on side surfaces of the nanocores are respectively represented as $t_a$ (nm) and $t_b$ (nm), the film thickness uniformity (%) is defined as $(t_a/t_b) \times 100$.

According to an example embodiment, a method of manufacturing a nanostructure semiconductor light-emitting device includes forming a plurality of multi-layer nanocores shells on a plurality of nanocores in accordance with standard process parameters to obtain a desired process relationship, if the plurality of multi-layer nanocores shells satisfy the desired process relationship, continue forming the plurality of multi-layer nanocores shells with standard process parameters, and if the plurality of multi-layer nanocores shells do not satisfy the desired process relationship, form the plurality of multi-layer nanocores shells with special process parameters, different from the standard process parameters wherein the special process parameters include at least one of a flux of a source gas, a flow rate of the source gas, a chamber pressure, a growth temperature, and a growth rate.

The desired process relationship is a film thickness uniformity of 80% or more, wherein when a minimum thickness and a maximum thickness of a film grown on side surfaces of each of the plurality of nanocores are respectively represented as $t_a$ (nm) and $t_b$ (nm), the film thickness uniformity (%) is defined as $(t_a/t_b) \times 100$.

When a height of each of the plurality of nanocores and a pitch between the plurality of nanocores are represented by H (μm) and P (μm), respectively, $H^2/P \geq 2.35$ is satisfied and the film thickness uniformity is 90% or more.

When a height of each of the plurality of nanocores and a pitch between the plurality of nanocores are represented by H (μm) and P (μm), respectively, $H^2/P \geq 3.36$ is satisfied.

The special process parameter includes controlling a flux of $NH_3$ to be 18000 sccm or more during growth of an active layer of the plurality of multi-layer nanocores shells.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
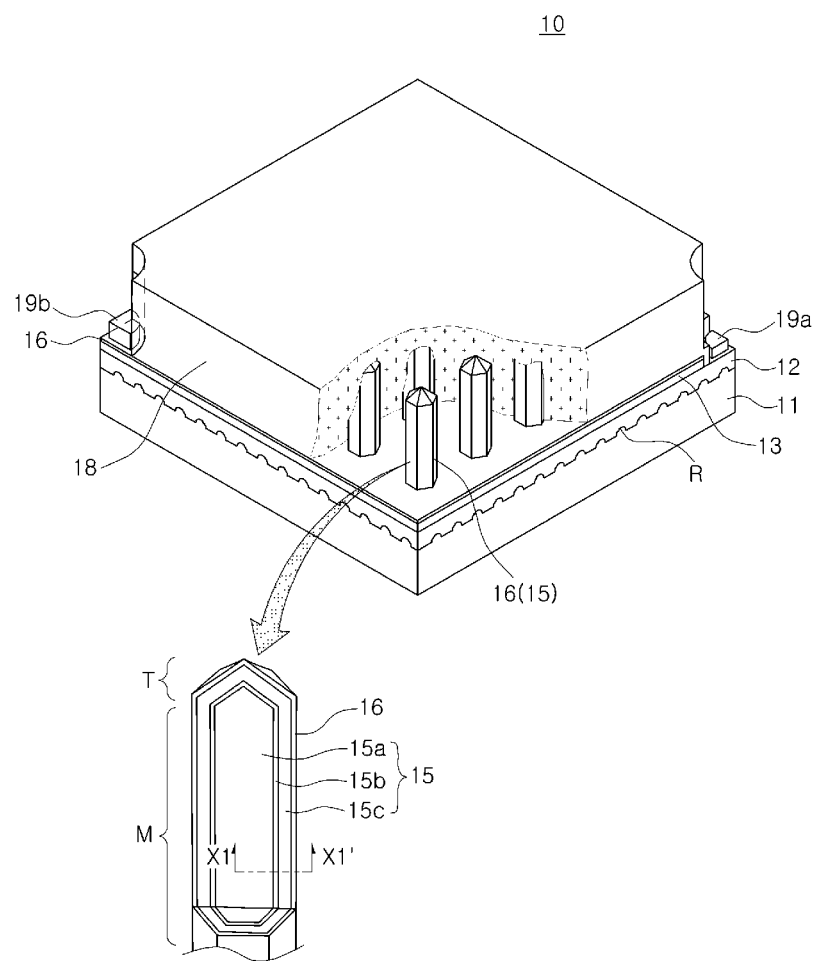
FIG. 1 is a schematic perspective view illustrating a nanostructure semiconductor light-emitting device according to an example embodiment of the present disclosure.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view (s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Reference throughout this disclosure to "one example embodiment" or "an example embodiment" is provided to emphasize a particular feature, structure, or characteristic, and do not necessarily refer to the same embodiment. Furthermore, the particular features, structures, or characteristics may be combined in any suitable manner in one or more embodiments. For example, a context described in a specific example embodiment may be used in other embodiments, even if it is not described in the other embodiments, unless it is described contrary to or inconsistent with the context in the other embodiments.

Figure 2:
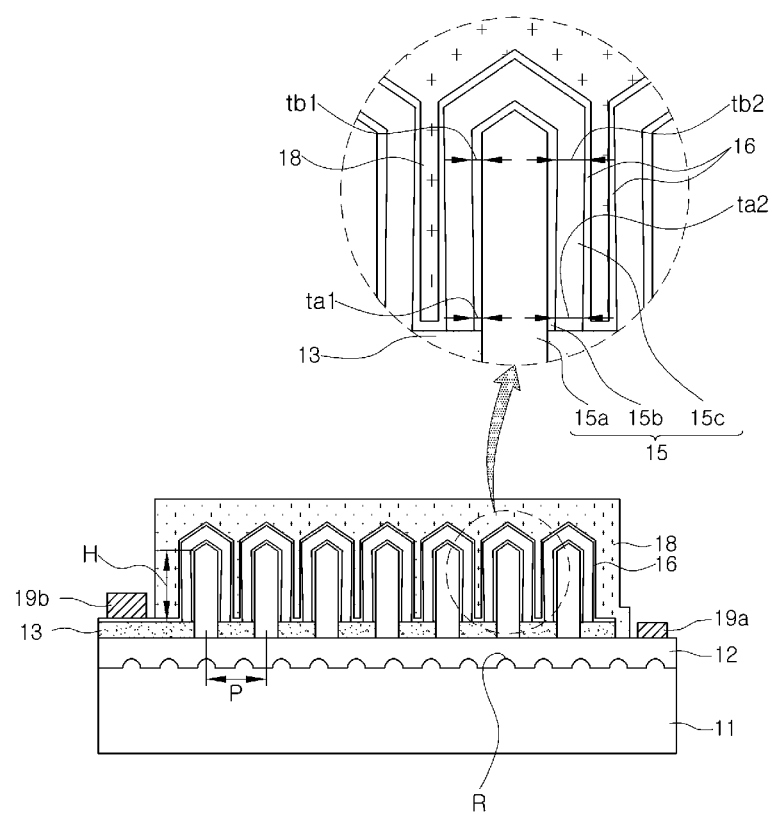
FIG. 2 is a cross-sectional view illustrating the nanostructure semiconductor light-emitting device of FIG. 1.

FIG. 1 is a schematic perspective view illustrating a nanostructure semiconductor light-emitting device according to an example embodiment of the present disclosure, and FIG. 2 is a cross-sectional view illustrating the nanostructure semiconductor light-emitting device of FIG. 1.

The nanostructure semiconductor light-emitting device 10 illustrated in FIG. 1 may include a base layer 12 formed of a first conductivity-type semiconductor material, and a plurality of light-emitting nanostructures 15 disposed thereon.

The nanostructure semiconductor light-emitting device 10 may include a substrate 11 having an upper surface on which the base layer 12 is disposed. A concave-convex portion R may be formed on the upper surface of the substrate 11. The concave-convex portion R may improve light extraction efficiency and improve a quality of a single crystal grown thereon. The substrate 11 may be an insulating, conductive, or semiconductor substrate. For example, the substrate 11 may include sapphire, SiC, Si, $MgAl_2O_4$, MgO, $LiAlO_2$, $LiGaO_2$, or GaN.

The base layer 12 may include a first conductivity-type nitride semiconductor layer, and provide a growth plane of the light-emitting nanostructures 15. The base layer 12 may be a nitride semiconductor satisfying $Al_xIn_yGa_{1-x-y}N$ (0≤x<1, 0≤y<1, and 0≤x+y<1), and may be doped with n-type impurities such as Si. For example, the base layer 12 may be n-type GaN.

An insulating layer 13 having openings for growing the light-emitting nanostructures 15 (in particular, nanocores 15a) may be formed on the base layer 12. The nanocores 15a may be formed on the base layer exposed by the openings in the base layer 12. The insulating layer 13 may be used as a mask for growing the nanocores 15a. For example, the insulating layer 13 may include $SiO_2$ or $SiN_x$.

Each of the light-emitting nanostructures 15 may include a hexagonal-structured main portion M and a tip T located on the main portion M. The main portion M of the light-emitting nanostructure 15 may have side surfaces having the same crystal plane, and the tip T of the light-emitting nanostructure 15 may have different crystal planes from the side surfaces of the light-emitting nanostructure 15. The tip T of the light-emitting nanostructure 15 may have a hexagonal pyramid structure. Such a structural distinction may be substantially determined by the nanocore 15a, and it may be understood that the nanocore 15a is divided into the main portion M and the tip T.

The light-emitting nanostructures 15 may include the nanocores 15a formed of a first conductivity-type nitride semiconductor material, and multilayer shell disposed on surfaces of the nanocores 15a. The multilayer shell may include active layers 15b and second conductive-type nitride semiconductor layers 15c. The nanocores 15a may be a nitride semiconductor material satisfying $Al_xIn_yGa_{1-x-y}N$ (0≤x<1, 0≤y<1, and 0≤x+y<1), similar to the base layer 12. For example, the nanocores 15a may be n-type GaN. The active layers 15b according to example embodiments may include a nitride semiconductor material containing indium (In). The active layers 15b may have a multiple quantum well (MQW) structure in which quantum well layers formed of $In_{y1}Ga_{1-y1}N$ ($y_2<y_1<1$) and quantum barrier layers formed of $In_{y2}Ga_{1-y2}N$ ($0≤y_2<y_1$) are alternately stacked. For example, the active layers 15b may have a GaN/InGaN MQW structure. As necessary, the active layers 15b may have a single quantum well (SQW) structure including indium. The second conductive-type nitride semiconductor layers 15c may be a crystal satisfying p-type $Al_xIn_yGa_{1-x-y}N$ (0≤x<1, 0≤y<1, and 0≤x+y<1), and may be formed in a plurality of layers, as needed.

As illustrated in FIG. 2, at least one of the active layers 15b and the second conductive-type nitride semiconductor layers 15c may have a film thickness uniformity of 90% or more. Here, when a minimum thickness and a maximum thickness of films grown on side surfaces of the nanocores 15a are respectively represented as $t_a$ (nm) and $t_b$ (nm), the "film thickness uniformity" used in the disclosure may be defined as $(t_a/t_b)×100$. In addition, a "film thickness variation" may be used as a term having a meaning opposite to that of film thickness uniformity, and may be expressed by a value obtained by subtracting the film thickness uniformity from 100.

In example embodiments of the present disclosure, it is difficult to ensure the film thickness uniformity under conditions such as the structure and arrangement of the nanocores 15a. For example, a height H and a pitch P of the nanocores 15a may affect the film thickness uniformity grown on the surfaces of the nanocores 15a. The greater the height H of the nanocores 15a and the smaller the pitch P of the nanocores 15a, the greater the film thickness variation in a vertical direction (a height direction) of the nanocores 15a may be. For example, in the active layers 15b and the second conductive-type nitride semiconductor layers 15c, thicknesses $t_{b1}$ and $t_{b2}$ of upper portions may be greater than thicknesses $t_{a1}$ and $t_{a2}$ of lower portions.

The nanocores 15a according to an example embodiment of the present disclosure may satisfy $H^2/P≥3.36$, when the height H of the nanocores 15a and the pitch P between the nanocores 15a are represented by H (μm) and P (μm), respectively. In this condition, it is difficult to ensure higher film thickness uniformity. However, according to example embodiments of the present disclosure, the film thickness uniformity of 80% or more may be implemented by changing process conditions. Here, the height H of the nanocores 15a may be defined as a height of side surfaces having the same crystal plane, for example, a height of the side surfaces of the main portions M of the nanocores 15a.

Even if at least one of the active layers 15b and the second conductive-type nitride semiconductor layers 15c has different thicknesses in the vertical direction (the height direction) of the nanocores 15a, the film thickness uniformity may be about 80% or more, furthermore, about 90%. In addition, process conditions to have the film thickness variation of about 5% or less, that is, the film thickness uniformity of about 95% or more may be implemented.

In the active layers 15b, a variation between the maximum thickness $t_{b1}$ of the upper portions and the minimum thickness $t_{a1}$ of the lower portions may be about 20% or less, preferably 10% or less. In the second conductive-type nitride semiconductor layers 15c, a variation between the maximum thickness $t_{b2}$ of the upper portions and the minimum thickness $t_{a2}$ of the lower portions may be about 20% or less, preferably 10% or less. For example, when the film thickness variation satisfies $H^2/P≥2.35$, the film thickness uniformity may be implemented as 90% or more.

Thus, even when increasing the height H of the nanocores 15a and increasing an arrangement density of the nanocores 15a in order to take advantage of the nanocores 15a, the film thickness uniformity of a multilayer shell (the active layers 15b and/or the second conductive-type nitride semiconductor layers 15c) may be achieved at a higher level. Accordingly, problems in optical and/or electrical characteristics due to the film thickness variation may be significantly reduced. For example, when the active layers 15b have higher variations in film thickness, a wavelength variation may increase or efficiency may be lowered since wavelengths differ depending on thicknesses of the active layers 15b. In this regard, a peak wavelength of light emitted from each of the active layers 15ab have a variation of about 3 nm or less. On the other hand, when the second conductive-type nitride semiconductor layers 15c (in particular, an electron blocking layer) have higher variations in film thickness, light-emitting efficiency may be reduced since current density is concentrated on a specific area. To solve such a problem, the light-emitting nanostructures 15 having higher light-emitting efficiency may be provided.

Figure 3:
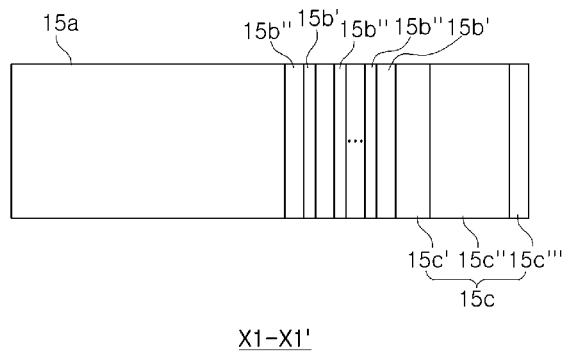
FIG. 3 is a schematic enlarged view of a stacked structure (X1-X1') of the nanostructure semiconductor light-emitting device illustrated in FIGS. 1 and 2.

A stacked structure of light-emitting nanostructures 15 according to an example embodiment of the present disclosure is illustrated in FIG. 3. FIG. 3 is a schematic enlarged view of a part X1-X1' in FIGS. 1 and 2.

Referring to the stacked structure specifically illustrated in FIG. 3, the nanocores 15a may be n-type GaN, and the active layers 15b may have an MQW structure in which quantum well layers 15b' formed of $In_{y1}Ga_{1-y1}N$ ($y_2<y_1<1$) and quantum barrier layers 15b'' formed of $In_{y2}Ga_{1-y2}N$ ($0 \leq y_2 < y_1$) are alternately stacked. The quantum barrier layers 15b'' may be GaN. The second conductive-type nitride semiconductor layers 15c may include a p-type AlGaN layer 15c' provided as an electron blocking layer (EBL) and a lower concentration p-type GaN layer 15c'' and a higher concentration p-type GaN layer 15c'''. The p-type AlGaN layer 15c' and the higher concentration p-type GaN layer 15c''' may be provided as the EBL and a contact layer, respectively.

It is difficult to grow a layer containing Al and/or In having a uniform thickness on a surface of the nanocores 15a. For example, active layers 15b containing In, such as an EBL 15c' containing Al or an InGaN quantum wells 15b' may be difficult to be grown to have a uniform thickness. However, according to example embodiments of the present disclosure, such layers may have a film thickness uniformity of 90% or more.

The nanostructure semiconductor light-emitting device 10 may include a contact electrode 16 connected to the second conductive-type semiconductor layers 15c. The contact electrode 16 according to example embodiments of the present disclosure may be formed of a transparent conductive material. The contact electrode 16 may be, but is not limited to, one of a transparent conductive oxide layer or a nitride layer so as to emit light in a direction toward a light-emitting nanostructure (in a direction opposite to the substrate). For example, indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \leq x \leq 1$). As necessary, the contact electrode 16 may include graphene.

The contact electrode 16 may not be limited thereto, and may include Ag, Ni, Al, Rh, Pd, Ir, Ru, Mg, Zn, Pt, or Au, or have a structure having two or more layers, such as Ni/Ag, Zn/Ag, Ni/Al, Zn/Al, Pd/Ag, Pd/Al, Ir/Ag, Ir/Au, Pt/Ag, Pt/Al, or Ni/Ag/Pt. As necessary, the contact electrode 16 may be implemented in a flip-chip structure by employing a reflective electrode structure.

An insulating protection layer 18 may be formed on upper surfaces of the light-emitting nanostructures 15. Such an insulating protection layer 18 may be a passivation layer for protecting the light-emitting nanostructures 15. In addition, the insulating protection layer 18 may be formed of light-transmissive material so that light generated from the light-emitting nanostructures 15 may be extracted. In example embodiments, a material having an appropriate refractive index may be selected as the insulating protection layer 18 to improve light extraction efficiency.

As shown in example embodiments, after forming the contact electrode 16, a space between the plurality of light-emitting nanostructures 15 may be filled with the insulating protection layer 18. As the insulating protection layer 18, an insulating material, such as $SiO_2$ or $SiN_x$, may be used. For example, the insulating protection layer 18 may include a material selected from tetraethyl orthosilicate (TEOS), borophosphosilicate glass (BPSG), spin-on-glass (SOG), CVD-$SiO_2$, and spin-on-dielectric (SOD). However, the insulating protection layer 18 according to example embodiments of the present disclosure may not be limited as a material for filling the space between the light-emitting nanostructures 15. For example, in some example embodiments, the space between the light-emitting nanostructures 15 may be filled with an electrode component such as a contact electrode.

The nanostructure semiconductor light-emitting device 10 may include first and second electrodes 19a and 19b. The first electrode 19a may be disposed on an exposed portion of the base layer 12 formed of a first conductivity-type semiconductor material. In addition, the second electrode 19b may be disposed on an extended and exposed portion of the contact electrode 16. The arrangement of the electrodes may not be limited thereto, and may be varied depending on a use environment.

Figure 4:
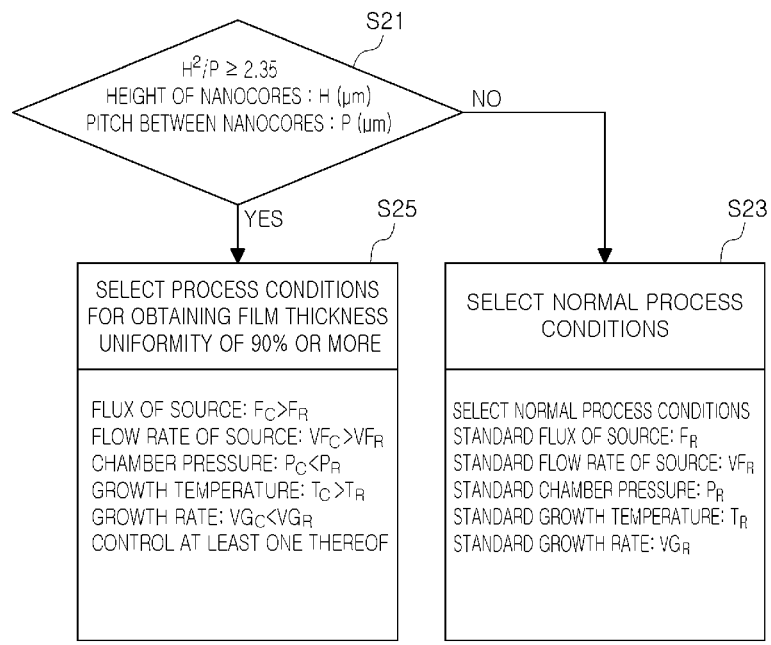
FIG. 4 is a flowchart illustrating a process of controlling film thickness uniformity in a method of manufacturing a nanostructure semiconductor light-emitting device according to an example embodiment of the present disclosure.

As illustrated in FIGS. 1 to 3, according to example embodiments of the present disclosure, a higher level of film thickness uniformity even under conditions in which the height of nanocores is large and the density of the placement is higher. Such film thickness uniformity may be implemented by controlling growth conditions. FIG. 4 is a flow-chart illustrating a process of controlling film thickness uniformity in a method of manufacturing a nanostructure semiconductor light-emitting device according to an example embodiment of the present disclosure.

First, in a stage S21, a condition of generating a film thickness variation is checked to determine whether a control process is to be applied or not. The condition of generating the film thickness variation may be checked by calculating the height H of each of the nanocores 15a and the pitch P between the nanocores 15a. When the height H of each of the nanocores 15a and the pitch P between the nanocores 15a are represented by H (μm) and P (μm), respectively, it may be determined whether $H^2/P \geq 2.35$ is satisfied or not. Such a condition may provide a structural condition to increase the light-emitting efficiency by increasing the height H or the arrangement density. However, the film thickness variation may be significantly increased.

In a stage S23, when the condition of generating the film thickness variation is not satisfied, a growth process according to a normal process conditions may be performed. Such a process condition may be a chemical vapor deposition (CVD) process such as a metal organic chemical vapor deposition (MOCVD) process. When each process parameter according to the normal process conditions is referred to as a standard process parameter, a parameter different from the standard process parameter may be selected and applied to the controlling process of increasing the film thickness uniformity in a stage S25. At least one among a variety of process parameters, e.g., variable or special process parameters, such as a flux of a source, a flow rate of the source, a chamber pressure, a growth temperature, and a growth rate, may be controlled.

For example, as shown in the stage S25, the film thickness uniformity may be improved by significantly increasing a flux $F_C$ of a source compared to a standard flux $F_R$ of the source $F_R$ and significantly increasing a flow rate $VF_C$ of the source compared to a standard flow rate of the source $VF_R$. By increasing the flux $F_C$ of the source, the flow rate $VF_C$ of the source may be increased. In the case of an MOCVD process, a flux $F_C$ of $NH_3$ gas may be increased, and thereby the flow control $VF_C$ of the source may be increased. Conversely, the flux $F_C$ of the source may be independently controlled using a parameter such as emissions. During the process of growing the active layers 15b, the flux of $NH_3$ may be controlled to be 18000 sccm or more. Like a group V source such as $NH_3$, the flux of a group III source may be controlled. For example, a flow rate $VF_C$ of trimethyl gallium (TMGa), trimethyl aluminum (TMAl), or trimethyl indium (TMIn) may be increased by increasing a flux thereof.

In addition, the film thickness uniformity may increase by lowering the chamber pressure $P_C$ compared to the standard chamber pressure $P_R$. The film thickness uniformity may also be controlled using at least one of the growth temperature $T_C$ and the growth rate $VG_C$. The growth temperature $T_C$ may be increased to be higher than the standard growth temperature $T_R$, or the growth rate $VG_C$ may be deceased to be lower than the standard growth rate $VG_R$. The control of the growth temperature $T_C$ may be advantageously used in the process of growing the second conductive-type nitride semiconductor layer or the quantum barriers of the active layers 15b. However, the control of the growth temperature $T_C$ may not be used in the process of growing the quantum wells due to a decrease of In inflow. During a process of growing the quantum barriers using an MOCVD process, the growth temperature $T_C$ may be controlled to be about 1000° C. or more. During a process of growing an electron barrier layer containing Al, the growth temperature $T_C$ may be controlled to be about 1050° C. or more.

The growth rate $VG_C$ may be controlled using a pressure or a temperature. However, in an MOCVD process, the growth rate $VG_C$ may be lowered by increasing a V/III ratio, that is, by decreasing the group III source. During the process of growing the quantum well, the growth rate $VG_C$ may be controlled to be 0.006 nm/sec or more. Similarly, during the process of growing the electron-blocking layer containing Al, the growth rate $VG_C$ may be controlled. For example, the growth rate $VG_C$ may be controlled by controlling the flux of TMGa to be 50 sccm or more.

Through such processes, at least one of the active layers 15b and the second conductive-type nitride semiconductor layers 15c may be grown to have the film thickness uniformity of about 90% or more. Further, the film thickness variation may be about 5% or less, that is, the film thickness uniformity may be about 95% or more.

The variation in thickness of a film formed on nanocores may increase depending on structural conditions of the nanocores, that is, conditions of generating the film thickness variation defined by a height and a pitch of the nanocores. Hereinafter, causes of the film thickness variation and the conditions of generating the film thickness variation will be described with reference to FIGS. 5 to 7.

Figure 5:
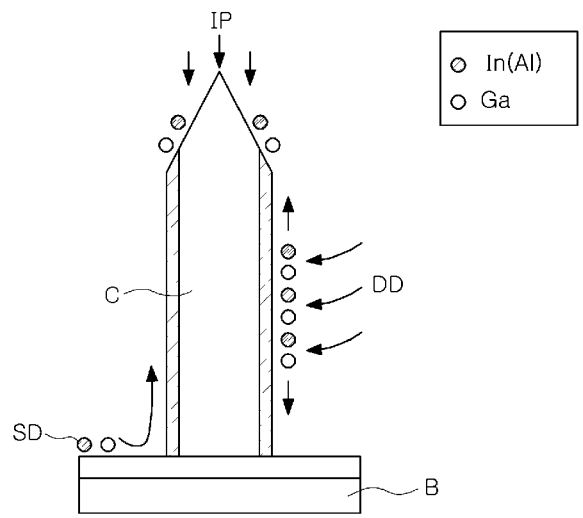
FIGS. 5 and 6 are schematic diagrams illustrating a process of forming non-uniform layers in light-emitting nanostructures.

FIG. 5 is a schematic diagram illustrating thermodynamic and kinetic modeling illustrating a process in which non-uniform films are formed on nanocores.

Referring to FIG. 5, a three-dimensional structured nanocore C disposed on a base layer B is illustrated. A group III source may be supplied to a surface of the nanocore C so as to allow a group III nitride layer to be grown. The group III source may be a source for In, Al, and Ga. For example, in an MOCVD process, the group III source gas may be supplied in the form of an organic metal gas, such as TMIn, TMGa, or TMAl.

The group III source gas may be supplied from an upper portion to a lower portion of the nanocore C. When the group III source comes into contact with the nanocore C, an impinging flux IP may be generated. The greater the impinging flux IP, the greater a thickness variation may be. The impinging flux IP may increase as a growth rate or a flux of the group III source increases. Accordingly, the film thickness uniformity may be improved by controlling such process parameters.

In addition, the group III source may be diffused along the surface of the nanocore C. This may be known as a direct diffusion DD. The more the direct diffusion DD, the smaller the thickness variation may be. Such a direct diffusion DD may increase as a flux and flow rate of a source (in particular, $NH_3$) increase. In addition, the direct diffusion DD may increase in a low pressure condition. Accordingly, the film thickness uniformity may be improved by increasing the flux and flow rate of the source (in particular, $NH_3$) or decreasing the pressure.

The group III source may also move along a surface of the base layer B to reach the nanocore C. This may be known as migration SD. Since, through the migration SD, the group III source is implanted in the lower portion of the nanocore C, where the film thickness is relatively small, the thickness variation may be reduced as the migration SD increases. The migration SD may increase by increasing a growth temperature.

Such a thermodynamic and kinetic parameters may be more sensitive in In and Al, having relatively great sizes, than Ga among the group III sources. Non-uniformity of the film thickness may increase in a process of growing a film containing In and/or a film containing Al.

Figure 6:
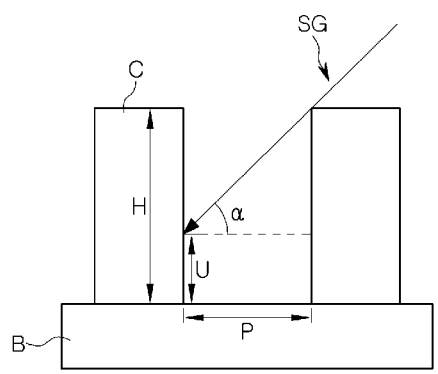

Such a thickness variation may be significantly influenced by structural conditions. FIG. 6 is a schematic diagram illustrating conditions of generating a film thickness variation.

Referring to FIG. 6, two nanocores C arranged on a base layer B are illustrated. An arrow SG represents a propagation path of a source gas having an inclination angle α, and a variation-generation area U may represent a lower portion of the nanocore C where a relatively less source gas is reached and therefore a relatively thin film is formed, compared to than an upper portion of the nanocores C. Such a variation-generation area U may be represented by U=H−d tan α when a height of the nanocore C is H.

That is, as the height H of each of the nanocores C increases and a pitch P between the nanocores C decreases, the variation-generation area U may extend. In order to increase a light-emitting area, since the height H needs to be increased and the pitch P between the nanocores C needs to be decreased (for a higher arrangement density), the film thickness variation may unfavorably increase.

In order to check the conditions of generating the film thickness variation, film thickness variations were measured while changing the height of each of nanocores and the pitch P between the nanocores.

Under the same growth conditions, the film thickness variations of active layers were measured while changing the height of each of the nanocores and the pitch between the nanocores as listed in Table 1.

TABLE 1

| Classification | A | B | C | D | E | F |
|---|---|---|---|---|---|---|
| Height (μm) | 1.7 | 1.7 | 1.7 | 2.7 | 2.7 | 2.7 |
| Pitch (μm) | 1.1 | 1.5 | 2.0 | 1.1 | 1.5 | 2.0 |

The thickness variations of the active layers were listed in Table 2 by measuring thicknesses of upper portions and thicknesses of lower portions. As a condition of generating the film thickness variations proportional to the calculated thickness variations, a relation $H^2/P$ was obtained.

TABLE 2

| Classification | A | B | C | D | E | F |
|---|---|---|---|---|---|---|
| Film Thickness Variation | 15% | 5% | 2% | 55% | 30% | 22.5% |
| Conditions of generating Thickness Variation ($H^2/P$) | 2.63 | 1.93 | 1.45 | 6.63 | 4.86 | 3.65 |

Figure 7:
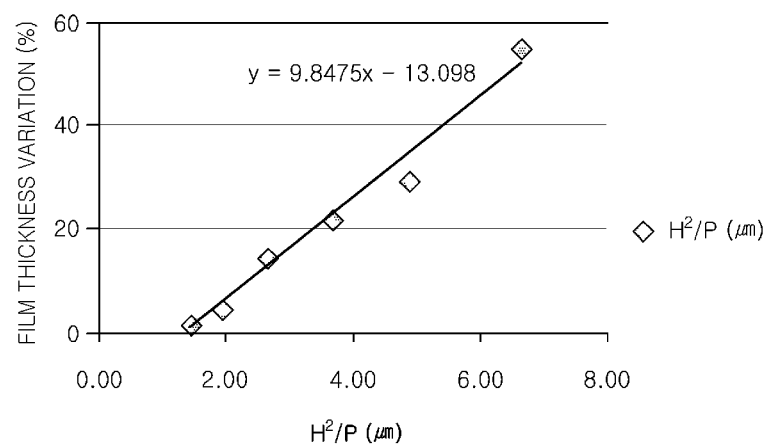
FIG. 7 is a graph illustrating conditions of generating film thickness variation.

Results listed in Table 2 are illustrated in FIG. 7. The relation between the variation-generating condition x and the film thickness variation y may be expressed as y=9.8475x−13.098. Through the results, the variation-generating condition x ($H^2/P$) by which a film thickness variation greater than 20% is generated may be calculated to be about 3.36. Using the condition, the film thickness uniformity of 80% or more may be achieved by controlling process parameters as provided in example embodiments of the present disclosure. Similarly, when the variation-generating condition is greater than 2.35, the film thickness uniformity of 90% or more, or even 95% or more may be achieved.

A method of manufacturing a nanostructure semiconductor light-emitting device according to an example embodiment of the present disclosure is illustrated in FIGS. 8A to 8E.

Figure 8A:
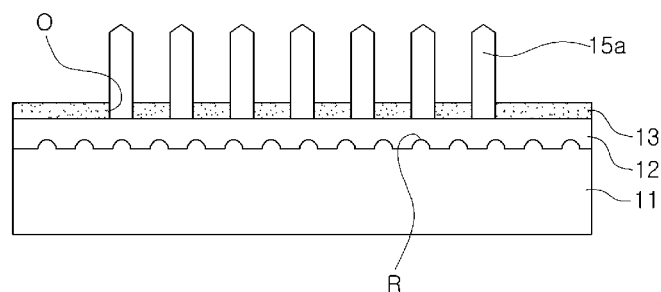
FIGS. 8A to 8E are cross-sectional views illustrating main processes of a method of manufacturing a nanostructure semiconductor light-emitting device according to an example embodiment of the present disclosure.

As illustrated in FIG. 8A, a plurality of nanocores 15a may be formed on a base layer 12 formed of a first conductivity-type nitride semiconductor material.

A substrate 11 may have an upper surface having the concave-convex portion R formed thereon. The base layer 12 may be formed on the upper surface of the substrate 11. An insulating layer 13 having openings O may be formed on the base layer 12. The nanocores 15a formed of a first conductivity-type nitride semiconductor material may be formed on exposed portions of the base layer 12 using the insulating layer 13 as a mask. In example embodiments, a height and an arrangement density of the nanocores 15a may be designed to ensure a higher light-emitting density. That is, when the height of the nanocores 15a and a pitch between the nanocores 15a are represented as H (μm) and P (μm), respectively, $H^2/P \geq 2.35$ may be satisfied.

Figure 8B:
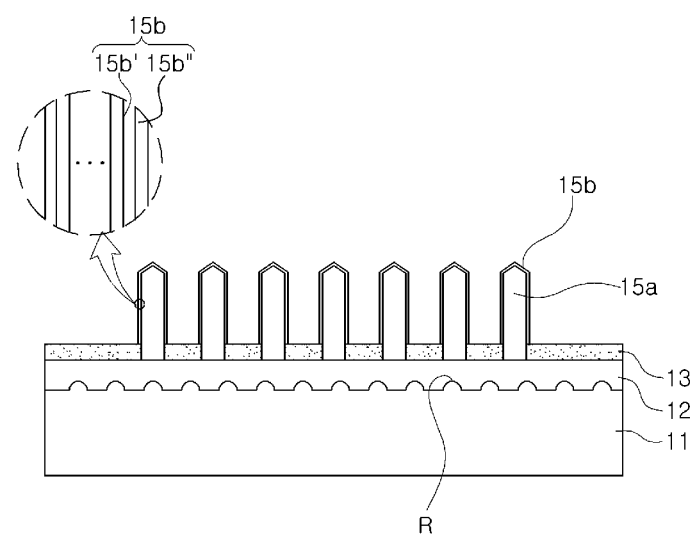

Next, as illustrated in FIG. 8B, active layers 15b may be formed on surfaces of the plurality of nanocores 15a.

The active layers 15b may have an MQW structure in which quantum wells 15b' and quantum barriers 15b" are alternately stacked. For example, the active layers 15b may have a GaN/InGaN MQW structure. At least one of the quantum wells 15b' and the quantum barriers 15b" may be formed to have a film thickness uniformity of 90% or more, or even 95% or more by controlling at least one of process parameters, such as a flux of a source, a flow rate of the source, a chamber pressure, a growth temperature, and a growth rate. The quantum wells 15b' may increase a film thickness uniformity to decrease wavelength variation. Peak wavelengths of light emitted from different areas of the active layers 15b may have variation of 3 nm or less. In order to ensure the film thickness uniformity, a growth temperature may be controlled to be 1000° C. or more during a process of growing the quantum barriers 15b". A flux of $NH_3$ may be controlled to be 18000 sccm or more during a process of growing the quantum wells 15b' and/or a process of growing the quantum barriers 15b". A growth rate may be controlled to obtain preferred or desired film thickness uniformity. During the process of growing the quantum wells 15b', the growth rate thereof may be controlled to be 0.006 nm/sec or less.

Figure 8C:
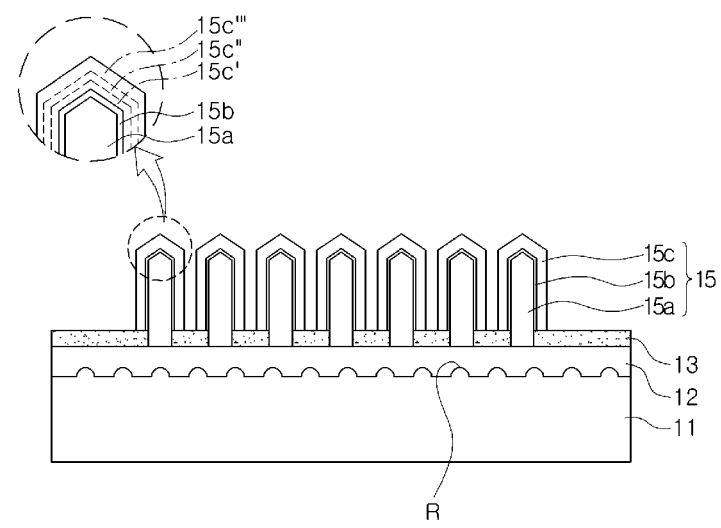

Next, as illustrated in FIG. 8C, second conductive-type nitride semiconductor layers 15c may be formed on the active layers 15b.

Through the process, the plurality of light-emitting nanostructures 15 may be formed. The second conductive-type nitride semiconductor layers 15c may be a crystal satisfying p-type $Al_xIn_yGa_{1-x-y}N$ (0≤x<1, 0≤y<1, and 0≤x+y<1), and may be configured of a plurality of layers as necessary. The second conductive-type nitride semiconductor layers 15c may be formed to have a film thickness uniformity of 80% or more, or even 90% or more by controlling at least one of process parameters, such as a flux of a source, a flow rate of the source, a chamber pressure, a growth temperature, and a growth rate. The second conductive-type nitride semiconductor layers 15c according to example embodiments of the present disclosure may include a p-type AlGaN layer 15c' provided as an EBL, a low-concentration p-type GaN layer 15c", and a higher-concentration p-type GaN layer 15c'''. The p-type AlGaN layer 15c' and the higher-concentration p-type GaN layer 15c''' may be provided as the EBL and a contact layer. Since electrical properties such as localized current crowding due to a thickness variation are degraded as well as the thickness variation of Al-containing EBL 15c' is larger than those of other layers, process parameters may be controlled during a process of growing the EBL 15c' so that the film thickness uniformity is achieved. During the process of growing the Al-containing EBL 15c', a growth temperature thereof may be controlled to be 1050° C. or more. During the process of growing the Al-containing EBL 15c', a growth rate thereof may be controlled to be a predetermined and/or desired level or less (e.g. a flux of TMGa is 50 sccm or more).

Figure 8D:
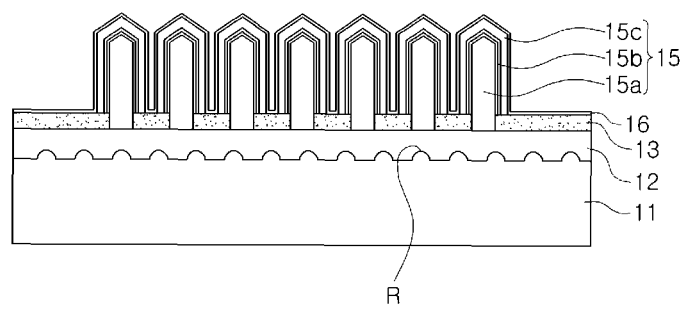

Next, as illustrated in FIG. 8D, a contact electrode 16 may be formed on the light-emitting nanostructures 15.

The contact electrode 16 may be formed on surfaces of the second conductive-type nitride semiconductor layers 15c. The contact electrode 16 according to example embodiments of the present disclosure may be formed of a transparent conductive material, but is not limited thereto. The contact electrode 16 may be one of a transparent conductive oxide layer and nitride layer. For example, The contact electrode 16 may be at least one selected from ITO, ZITO, ZIO, GIO, ZTO, FTO, AZO, GZO, $In_4Sn_3O_{12}$ and $Zn_{(1-x)}Mg_xO$. As necessary, the contact electrode 16 may be formed of a reflective electrode material.

Figure 8E:
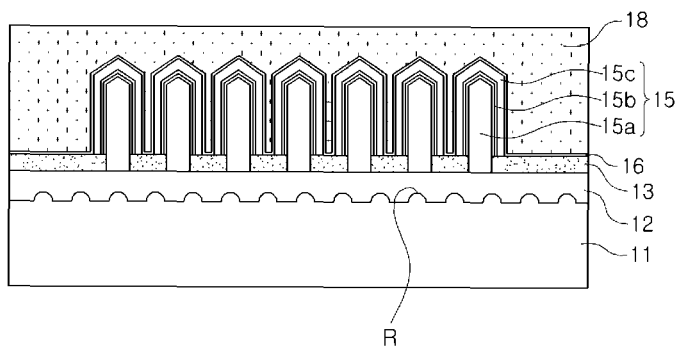

Next, as illustrated in FIG. 8E, an insulating protection layer 18 may be formed to fill spaces S between the light-emitting nanostructures 15.

The insulating protection layer 18 may be formed of a light-transmitting material. The insulating protection layer 18 may be formed by using a deposition process such as CVD or PVD, a spin process, or a reflow process. For example, the insulating protection layer 18 may be formed of TEOS, BPSG, CVD-$SiO_2$, SOG, or SOD. Alternatively, the insulating protection layer 18 may be formed of a light-transmitting resin selected from epoxy resin, silicone resin, polyethylene, and polycarbonate.

The nanostructure semiconductor light-emitting device according to example embodiments of the present disclosure may be fabricated using a variety of methods. FIGS. 9A to 9G illustrate a method of manufacturing a nanostructure semiconductor light-emitting device according to an example embodiment of the present disclosure. FIGS. 9A to 9G illustrate a process of growing nanocores by using a mask as a mold structure and filling thereof with the nanocores. The process may be understood as a process substituting the process of forming the light-emitting nanostructures illustrated in FIGS. 8A and 8.

Figure 9A:
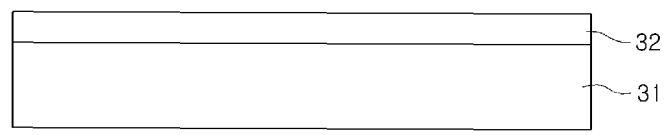
FIGS. 9A to 9G are cross-sectional views illustrating main processes of a method of manufacturing a nanostructure semiconductor light-emitting device according to an example embodiment of the present disclosure.

As illustrated in FIG. 9A, a first conductivity-type nitride semiconductor is grown on a substrate 31 to provide a base layer 32.

The base layer 32 may provide not only a crystal growth plane for light-emitting nanostructures, but also a structure electrically connecting the light-emitting nanostructures. Accordingly, the base layer 32 may be formed of a single crystal semiconductor material having electrical conductivity. When the base layer 32 is directly grown on the substrate 31, the substrate 31 may be a substrate for crystal growth. Before the base layer 32 is grown, a multilayered structure including a buffer layer including $Al_xIn_yGa_{1-x-y}N$ ($0 \leq x \leq 1$, $0 \leq y \leq 1$, and $0 \leq x+y \leq 1$) may be formed on the substrate 31. In the multilayered structure, intermediate layers including an undoped GaN layer, an AlGaN layer, or a combination thereof may be included for reducing or preventing current leakage from the base layer 32 to the buffer layer and improving crystal quality of the base layer 32.

Figure 9B:
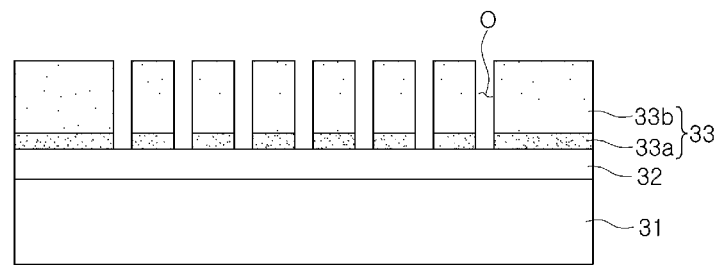

Next, as illustrated in FIG. 9B, a mask 33 including a plurality of openings O and an etch-stop layer may be formed on the base layer 32.

The mask 33 according to example embodiments of the present disclosure may include a first material layer 33a formed on the base layer 32, and a second material layer 33b formed on the first material layer 33a and having a greater etch rate than the first material layer 33a.

The first material layer 33a may be provided as the etch-stop layer. That is, the first material layer 33a may have a lower etch rate than the second material layer 33b under conditions of etching the second material layer 33b. At least the first material layer 33a may be an electrically insulating material and, as necessary, the second material layer 33b may also be an insulating material.

The first and second material layers 33a and 33b may be formed of different materials from each other so as to have preferably different etch rates. For example, the first material layer 33a may be a SiN-based material, and the second material layer 33b may be $SiO_2$. Conversely, such different etch rates may be obtained using a pore density. The different etch rates of first and second material layers 33a and 33b may be achieved by forming the second material layer 33b or both the first and second material layers 33a and 33b with a porous material and controlling difference in porosity. In example embodiments, the first and second material layers 33a and 33b may be formed of the same material. For example, the first material layer 33a may be formed of $SiO_2$ having a first porosity, and the second material layer 33b may be formed of the same $SiO_2$ as the first material layer 33a and having a second porosity greater than the first porosity. Thus, the first material layer 33a may have the lower etch rate than the second material layer 33b under the condition of etching the second material layer 33b.

A total thickness of the first and second material layers 33a and 33b may be designed in consideration of a preferred or desired height of the light-emitting nanostructures. For example, the height of the mask 33 may be at least the same as or greater than a height of side surfaces of the nanocores. According to example embodiments of the present disclosure, an etch-stop level by the first material layer 33a may be designed in consideration of the total height of the mask 33 from a surface of the base layer 32. After the first and second material layers 33a and 33b are sequentially formed on the base layer 32, the plurality of openings O may be formed to expose portions of the base layer 32. The formation of the openings O may include forming a photoresist on the mask 33 and performing a photolithography and a wet/dry etching process using the photoresist. The size of each of the openings O may be designed in consideration of a size of the light-emitting nanostructures. For example, the openings O exposing the base layer 32 may have a width (a diameter) of 600 nm or less, and furthermore 50 to 500 nm.

The openings O may be formed using a semiconductor process. For example, the openings O may be formed to have a higher aspect ratio using a deep-etching process. The aspect ratio (depth:width) of the openings O may be 5:1 or more, and furthermore 10:1 or more.

Although different depending on etch conditions, normally the openings O in the first and second material layers 33a and 33b may have a width gradually decreasing toward the base layer 32.

Normally, the deep-etching process may include a dry-etching process, and use reactive ions generated from plasma and ion beams generated in a higher vacuum condition. Such a dry etch may enable more precise processing on microstructures without any geometrical limitation, compared to a wet etch. A CF-based gas may be used to etch the oxide layer of the mask 33. For example, an etchant in which at least one of $O_2$ and Ar is combined with a gas, such as $CF_4$, $C_2F_6$, $C_3F_8$, $C_4F_8$, or $CHF_3$.

Figure 10A:
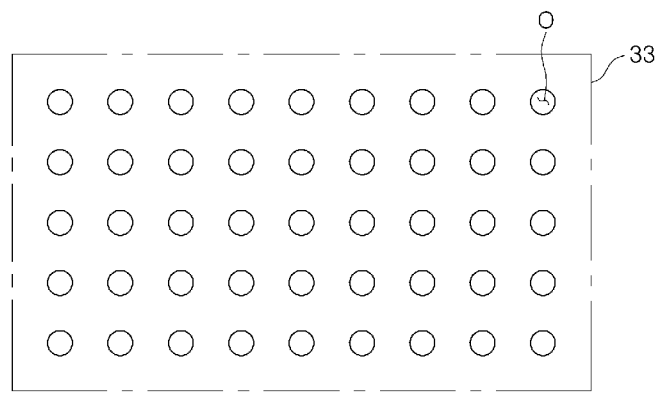
FIGS. 10A and 10B are plan views of masks including openings having various shapes.
Figure 10B:
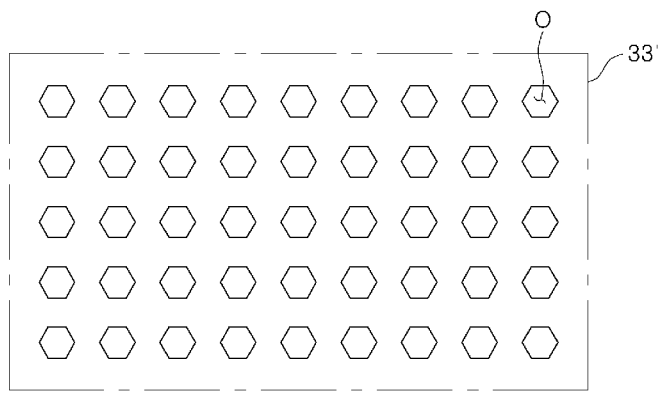

A planar shape and an arrangement of the openings O may be implemented in various forms. For example, the planar shape may be implemented in various forms, for example, in a polygonal, rectangular, over, or circular shape. The mask 33 illustrated in FIG. 9B may have an array of openings O having a circular cross-section, as illustrated in FIG. 10A. However, the mask 33 may have a different shape and arrangement, as necessary. For example, as a mask 33' illustrated in FIG. 10B, the mask 33 illustrated in FIG. 9B may have an array of openings O having a regular hexagonal cross-section.

Figure 11A:
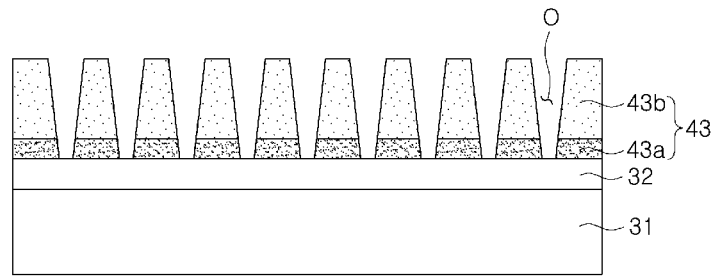
FIGS. 11A and 11B are cross-sectional views of masks including openings having various shapes.
Figure 11B:
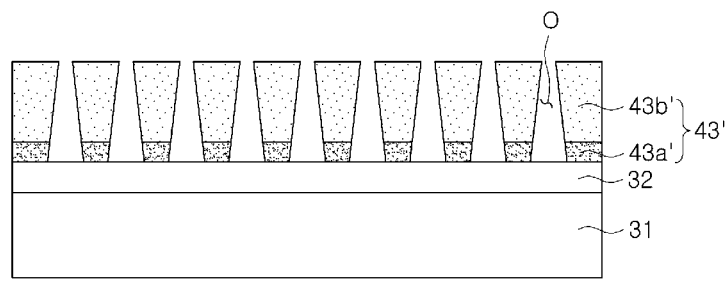

The openings O illustrated in FIG. 9B exemplarily has a structure of a rod having a constant diameter (or a width), but are not limited thereto. The openings O may have a variety of structures using an appropriate etching process. For example, masks including openings O having different shapes are illustrated in FIGS. 11A and 11B. In FIG. 11A, a mask 43 including first and second material layers 43a and 43b may include pillar-shaped openings O having cross-sectional areas increasing toward upper portions thereof. In FIG. 11B, a mask 43' including first and second material layers 43a' and 43b' may include pillar-shaped openings O having cross-sectional areas decreasing toward lower portions thereof.

Figure 9C:
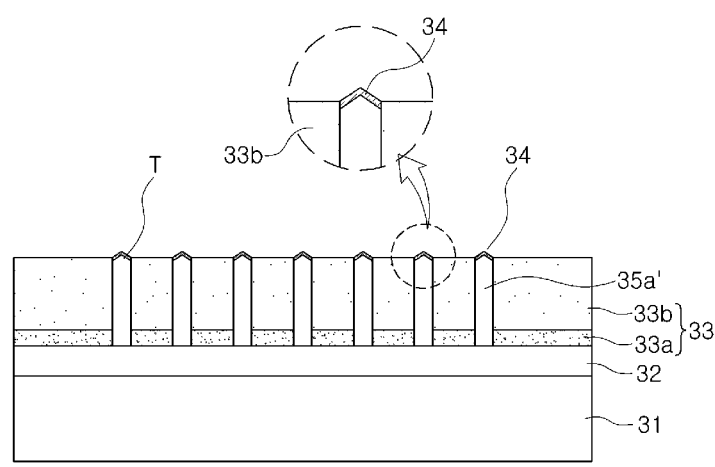

Next, as illustrated in FIG. 9C, a plurality of nanocores 35a' may be formed by growing first conductivity-type nitride semiconductor materials on the exposed portions of the base layer 32 to fill the plurality of openings O, and then current-reducing intermediate layers 34 may be formed on tips T of the nanocores 35a'.

The nanocores 35a' may be an n-type nitride semiconductor material, and the same material as the base layer 32. For example, the base layer 32 and the nanocores 35a' may be formed of n-type GaN.

The single crystal nitride including the nanocores 35a' may be formed using an MOCVD or MBE process, and the mask 33 may function as a mold for the single crystal nitride to provide nanocores 35a' corresponding to the shape of the openings O. That is, the single crystal nitride may be selectively grown on the portions of the base layer 32, exposed in the openings by the mask 33, and may fill the openings O. The single crystal nitride filling the openings O may have a shape corresponding to the shape of the openings O.

While the mask 33 remains, the current-reducing intermediate layers 34 may be formed on surfaces of the tips T of the nanocores 35a'. Accordingly, the current-reducing intermediate layers 34 may be easily formed on the tips T of the nanocores 35a' with no additional process for forming the mask.

The current-reducing intermediate layers 34 may be a semiconductor layer intentionally undoped, or doped with second conductive-type impurities opposite to the nanocores 35a'. For example, when the nanocores 35a' is n-type GaN, the current-reducing intermediate layers 34 may be undoped GaN or a GaN doped with p-type impurities such as Mg. In example embodiments, the nanocores 35a' and the current-reducing intermediate layers 34 may be successively formed by changing only the type of impurities in the same growth process. Thus, overall processes may be more simplified by combining a process of forming the current-reducing intermediate layers 34 and a molding process.

Figure 9D:
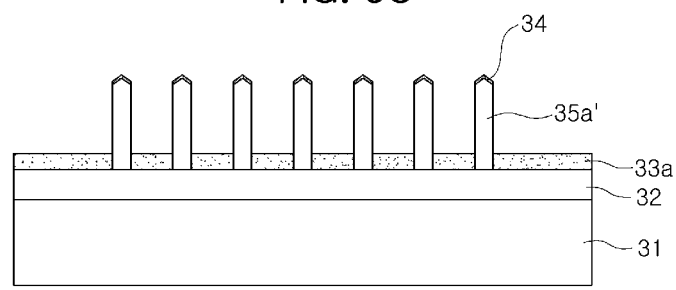

Next, as illustrated in FIG. 9D, the mask 33 may be removed to the first material layer 33a, that is, the etch-stop layer, to partially expose side surfaces of the plurality of nanocores 35a'.

According to an example embodiment of the present disclosure, since an etching process capable of selectively removing the second material layer 33b is applied, only the second material layer 33b may be removed while the first material layer 33a remains. The remaining first material layer 33a may function to reduce or prevent the active layers 35b and the second conductive-type nitride semiconductor layer 35c from being in contact with the base layer 32 during a subsequent growth process.

In the process of manufacturing light-emitting nanostructures using the mask 33 having the openings O as a mold as described in example embodiments, an additional heat treatment process or a regrowth process may be applied in order to improve crystallinity.

First, a stabilization process (a heat treatment process) of the nanocores 35a' may be additionally performed in order to improve crystal quality of nanocores 35a' during the process of growing the nanocores 35a' before the current-reducing intermediate layers 34 is formed. That is, when the nanocores 35a' are grown to a mid-point of a preferred or desired final growth height thereof (a height of 0.2 to 1.8 μm from the base layer 32), a heat treatment may be performed at a temperature similar to a temperature of the substrate 31 during the growth process (about 1000 to 1200° C.) in an NH₃ atmosphere for about 5 seconds to about 5 minutes, while stopping supplying of a TMGa source, that is, a group III element source of GaN.

Figure 9E:
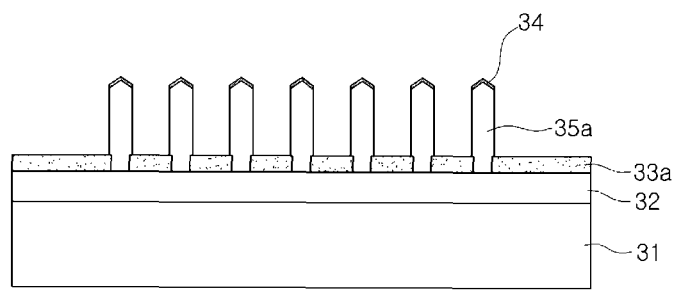

Next, as illustrated in FIG. 9E, after the growth of the nanocores 35a' is completed and the upper layer (the second material layer) 33b of the mask 33 is removed, a heat treatment or a re-growth process may be performed on the surfaces of the nanocores 35a' under a certain condition in order to convert crystal planes of the nanocores 35a to stable planes, which is advantageous for crystal growth, such as semi-polar or non-polar crystal planes. Such a process will be described with reference to FIGS. 12A and 12B.

Figure 12A:
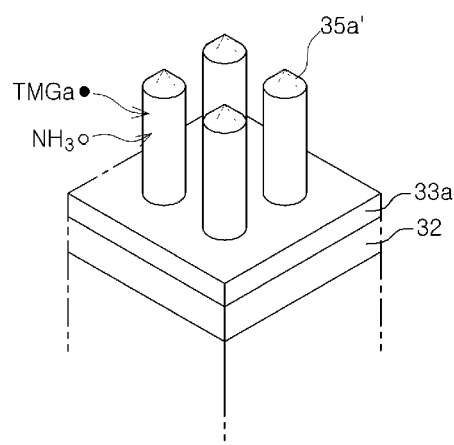
FIGS. 12A and 12B are schematic diagrams illustrating a re-growth process applicable in processes of FIGS. 9D and 9E, respectively.
Figure 12B:
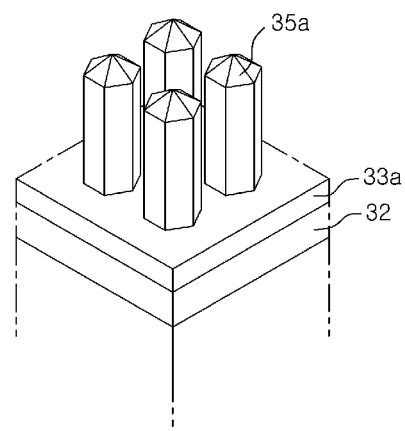

FIGS. 12A and 12B are schematic diagrams illustrating a heat treatment process or a re-growth process applicable in the processes of FIGS. 9D and 9E, respectively. Nanocores 35a' illustrated in FIG. 12A may be understood as being the nanocores 35a' obtained in the process of FIG. 9B. The nanocores 35a' may have crystal planes determined depending on the shape of the openings O. Although different depending on the shape of the openings O, surfaces of the nanocores 35a' through the above-described process may have relatively unstable crystal planes, and this may be unfavorable conditions for a subsequent crystal growth process.

According to example embodiments of the present disclosure, when the openings O have a cylindrical rod shape, the side surfaces of the nanocores 35a' may have curved surfaces as illustrated in FIG. 12A, other than specific crystal planes.

By performing a heat treatment or a re-growth process on the nanocores 35a', the unstable crystal planes may be re-arranged or re-grown to be stable crystal planes, such as semi-polar or non-polar crystal planes, as illustrated in FIG. 12B.

For example, the heat treatment may be performed at a temperature of 600° C. or more, preferably 800 to 1200° C. in some embodiments, for several seconds to several tens of minutes (1 second to 60 minutes). When the temperature of the substrate 31 is lower than 600° C., it is difficult to obtain an effect of the heat treatment since crystal growth and re-arrangement of the nanocores 35a' are difficult. In addition, when the temperature of the substrate 31 is higher than 1200° C., nitrogen (N) is evaporated from the GaN crystal plane resulting in degradation of crystal quality. In addition, it is difficult to expect a sufficient effect of the heat treatment in a short time less than one second, and the efficiency of a manufacturing process may be lowered when the heat treatment is performed for a long time, for example, more than 60 minutes.

In the case of re-growth process, stable crystal planes may be obtained by performing an MOCVD process under conditions similar to the growth conditions of the nanocores 35a'. For example, the surfaces of the nanocores 35a may be stabilized by performing the MOCVD process for re-growing the n-type GaN after growing the n-type GaN nanocores 35a'. Such a re-growth process may be performed in a chamber under conditions similar to the growth conditions of the nanocores 35a'.

As illustrated in FIG. 12A, when the nanocores 35a' are grown on a C(0001) plane of a sapphire substrate (a (111) plane of a silicon substrate), cylindrical-shaped nanocores (35a' of FIG. 12A) having curved side surfaces, which are unstable crystal planes, may be converted into hexagonal-shaped nanocores (35a of FIG. 12B) having non-polar surfaces (m plane), which are stable crystal planes, by performing the heat treatment or re-growth process on the cylindrical-shaped nanocores 35a' in the above-described appropriate temperature range. Such a crystal plane stabilization process may be implemented by the higher-temperature heat treatment process or the re-growth process.

Through the heat treatment process at a higher temperature, crystals disposed in the surfaces of nanocores 35a' may be re-arranged or, when source gases remain in the chamber, the remaining source gases are deposited on the surfaces of the nanocores 35a' so that the nanocores 35a' are partially re-grown to have stable crystal plane.

In addition, in the case of the re-growth process, the same source gases, such as TMGa and NH₃, may be supplied to an additional MOCVD chamber under conditions to the conditions in the process of growing the nanocores 35a' as illustrated in FIG. 12A, and the supplied source gases may react with the surfaces of the nanocores 35a'. Thus, the nanocores 35a' may be re-grown to be the nanocores 35a having stable crystal planes. Widths of the re-grown nanocores 35a may be slightly greater than width of the nanocores 35a before the re-growth (refer to FIGS. 12A and 12B, please).

In this manner, by introducing the heat treatment and/or the re-growth process after removing the mask 33, crystallinity of the nanocores 35a may be improved. That is, through such additional processes, not only non-uniformity (e.g. defects) of the surfaces of the nanocores 35a may be removed, but also crystal stability of the nanocores 35a may be significantly improved through the rearrangement of internal crystals.

Figure 9F:
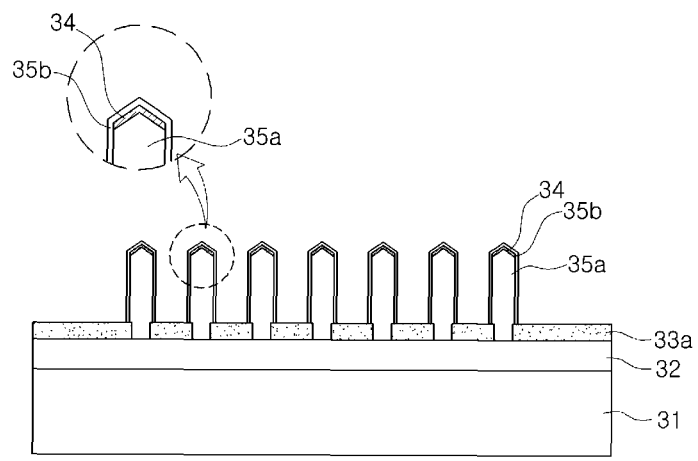

Next, as illustrated in FIG. 9F, active layers 35b may be sequentially grown on the surfaces of the plurality of nanocores 35a.

The active layers 35b may have an MQW structure in which quantum wells and quantum barriers are alternately stacked as illustrated in FIG. 8B. At least one of the quantum wells and the quantum barriers may be formed to have a film thickness uniformity of 80% or more and even 90% or more, by controlling at least one process parameter of a flux of a source, a flow rate of the source, a chamber pressure, a growth temperature, and a growth rate.

The nanocores 35a may include tips having different crystal planes from the side surfaces thereof. Accordingly, portions (II) of the active layers 35b and second conductive-type nitride semiconductor layers 35c, formed on the tips of the nanocores 35a, may have different composition and/or thickness from portions (I) of the active layers 35b and second conductive-type nitride semiconductor layers 35c, formed on the side surfaces of the nanocores 35a, as described above.

In order to solve problems such as leakage currents and wavelength scattering arising therefrom, the current-reducing intermediate layers 34 may be disposed on the tips of the nanocores 35a. Through selective arrangement of the current-reducing intermediate layers 34, current flows through active layers 35b formed on the side surfaces of the nanocores 35a may be normally guaranteed while current flows through active layers 35b formed on the tips of the nanocores 35a are cut-off by the current-reducing intermediate layers 34. Accordingly, leakage current concentrated on the tips of the nanocores 35a may be effectively cut-off, and excellent light-emitting efficiency may be obtained.

Figure 9G:
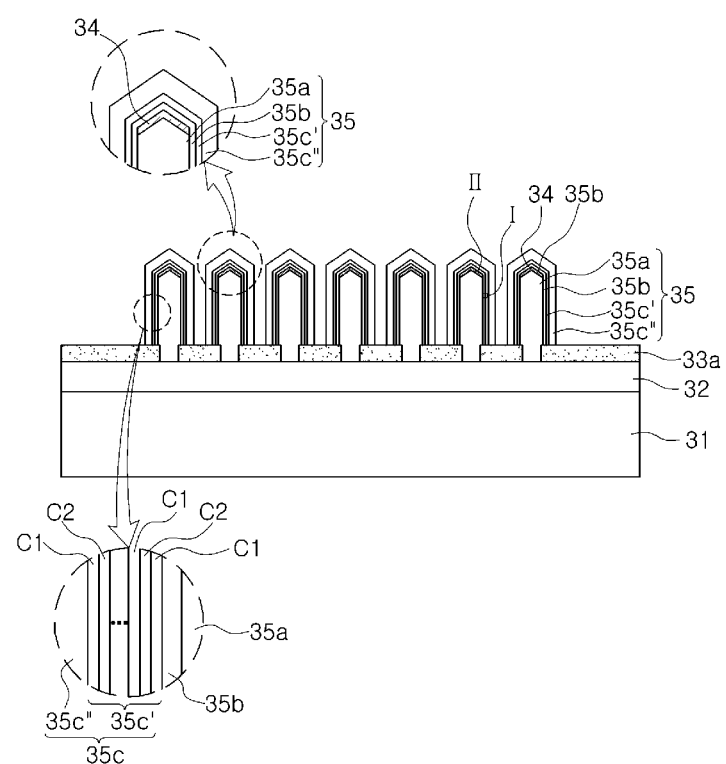

Next, as illustrated in FIG. 9G, the second conductive-type nitride semiconductor layers 35c may be grown on the active layers 35b.

Through such a process, the light-emitting nanostructures 35 may have a core-shell structure in which the nanocores 35a formed of a first conductivity-type nitride semiconductor material, and a shell layer including the active layers 35b and the second conductive-type nitride semiconductor layers 35c and surrounding the nanocores 35a.

The second conductive-type nitride semiconductor layers 35c may include Al-containing EBL 35c', low concentration p-type GaN layers 35c'', and higher concentration p-type GaN layers 35c'''. The Al-containing EBL 35c' may have a multilayered structure in which an Al-containing nitride layer C1 and an Al-free nitride layer C2 are alternately stacked several times. Due to the multilayered structure, the film thickness uniformity may be improved to a level of 80% or more without controlling process conditions. Furthermore, during a process of growing the second conductive-type nitride semiconductor layers 35c, as described with reference to FIG. 8C, at least one process parameter of a flux of a source, a flow rate of the source, a chamber pressure, a growth temperature, and a growth rate may be controlled.

A mask according to example embodiments of the present disclosure may include two material layers, but is not limited thereto. The mask may include three or more material layers.

For example, when the mask includes first to third material layers sequentially formed on a base layer, the second material layer may be an etch-stop layer and may be formed of a different material from the first and second material layers. As necessary, the first and second material layers may be formed of the same material.

Since the second material layer has a lower etch rate than the third material layer under conditions of etching the third material layer, the second material layer may serve as the etch-stop layer. At least the first material layer may be an electrically insulating material and, as necessary, the second or third material layer may also be an insulating material.

FIGS. 13A to 13D are cross-sectional views illustrating main processes of forming light-emitting nanostructures using the mask 43 illustrated in FIG. 11A.

Figure 13A:
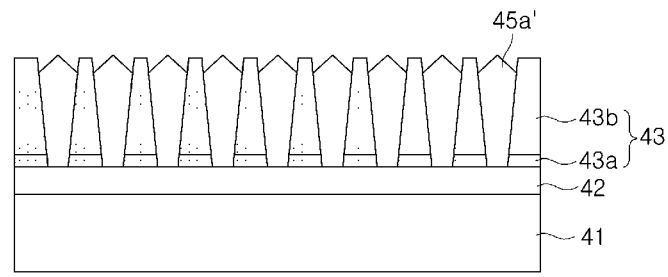
FIGS. 13A to 13D are cross-sectional views illustrating main processes of a method of manufacturing a nanostructure semiconductor light-emitting device according to an example embodiment of the present disclosure.

As illustrated in FIG. 13A, nanocores 45a' may be grown on a base layer 42 using a mask 43. The base layer 42 may be formed on a substrate 41. The mask 43 may include openings O whose width decreases toward a bottom surface thereof. The nanocores 45a' may be grown to have shapes corresponding to shapes of the openings O.

In order to further improve crystal quality of the nanocores 45a', one or more heat treatment process may be introduced during the growth process. In particular, surfaces of tips of the nanocores 45a' may be rearranged to have hexagonal pyramidal crystal planes to have more stable crystal structure, and crystals subsequently grown thereon may have higher quality.

The heat treatment process may be performed in the above-described temperature condition. For example, for convenience process, the heat treatment process may be performed at a temperature the same as or similar to the growth temperature of the nanocores 45a'. In addition, the heat treatment process may be performed in an $NH_3$ atmosphere by stopping supply of a metal source such as TMGa while maintaining a pressure/temperature the same as or similar to the growth pressure/temperature of the nanocores 45a'. Such a heat treatment process may continue for several seconds to several tens of minutes (e.g. 5 seconds to 30 minutes). However, a sufficient effect may be obtained within 10 seconds to 60 seconds.

Accordingly, since the heat treatment process introduced during the process of growing the nanocores 45a' reduces or prevents degradation of crystallinity of the nanocores 45a' caused by fast growth thereof, excellent crystal quality and fast crystal growth may be achieved at the same time.

A required amount of time and number of the heat treatment processes for stabilization may be variously changed according to a height and a diameter of final nanocores. For example, when a width of the openings O are 300 to 400 nm, and a height of the openings O (a thickness of the mask 43) is about 2.0 μm, the nanocores 45a' having higher quality may be grown by inserting a stabilization time of 10 seconds to 60 seconds when the nanocores 45a' has grown to an intermediate height, that is, 1.0 μm. It is obvious that such a stabilization process may be omitted depending on conditions of growing the nanocores 45a'.

Figure 13B:
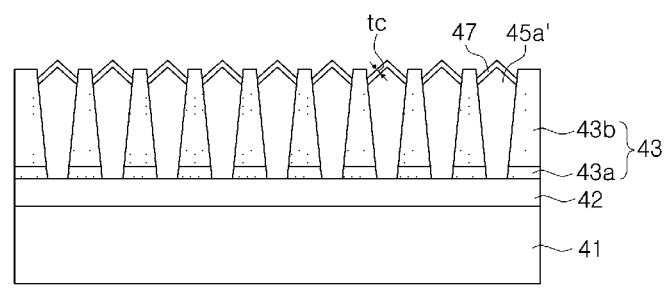

Next, as illustrated in FIG. 13B, current-reducing intermediate layers 47 may be formed on the nanocores 45a', as illustrated in FIG. 13B.

After forming the nanocores 45a' to have an appropriate height, the current-reducing intermediate layers 47 may be formed on the surfaces of the tips of the nanocores 45a' while leaving the mask 43 intact. Thus, the current-reducing intermediate layers 47 may be easily formed on preferred or desired areas (the surfaces of the tips) of the nanocores 45a' by using the mask 43 intact as is, without forming an additional mask.

The current-reducing intermediate layers 47 may be a semiconductor layer intentionally undoped, or doped with second conductive-type impurities opposite to the nanocores 45a'. For example, when the nanocores 45a' is n-type GaN, the current-reducing intermediate layers 47 may be undoped GaN or a GaN doped with p-type impurities such as Mg. The current-reducing intermediate layers 47 may have a thickness of about 50 nm or more to ensure sufficient electrical resistance. The second conductive-type impurities (e.g. n-type impurities: Si) of the current-reducing intermediate layers 47 may be about $1.0 \times 10^{16}/cm^3$ or more. The thickness of the current-reducing intermediate layers doped with the second conductive-type impurities may be implemented complementarily to the concentration of the second conductive-type impurities. For example, when the thickness is low, the resistance may be achieved by increasing the doping concentration, and vice versa.

In some example embodiments, the thickness of the current-reducing intermediate layers 47 may be in the range of about 200 nm to about 300 nm when it grows for one minute by injecting Mg while stopping doping of Si under the same condition as in the growth process of the n-type GaN nanocores. Such current-reducing intermediate layers 47 may function to effectively cut off leakage current of several μA or more. Accordingly, in such a molding-type process according to example embodiments of the present disclosure, the process of forming the current-reducing intermediate layers 47 may be simplified.

Figure 13C:
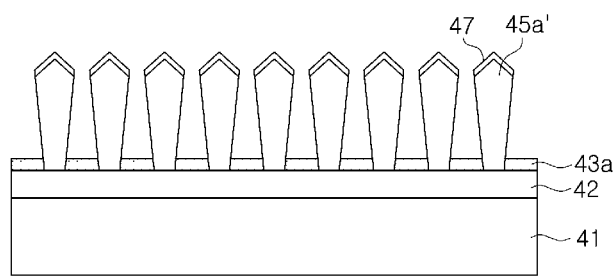

Next, as illustrated in FIG. 13C, the mask 43 may be removed to the first material layer 43a, that is, the etch-stop layer, to expose side surfaces of the plurality of nanocores 45a'.

According to example embodiments of the present disclosure, only the second material layer 43b may be removed and the first material layer 43a may remain, by using an etching process capable of selectively removing the second material layer 43b. In the process of manufacturing light-emitting nanostructures using a mask including openings as a mold, as described in example embodiments of the present disclosure, an additional heat treatment process may be introduced to improve crystallinity.

Figure 13D:
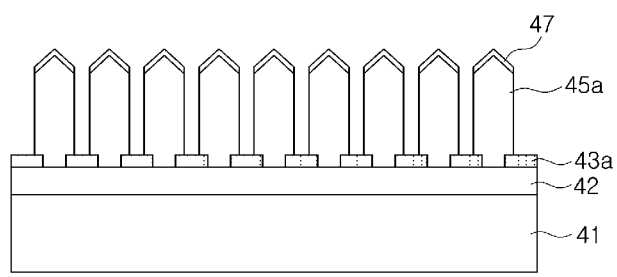

After the second material layer 43b of the mask 43 is removed, the surfaces of the nanocores 45a' may be subjected to a heat treatment under a certain condition, or a re-growth process for growing first conductivity-type semiconductor layers such as n-type GaN may be performed, to convert unstable crystal planes of the nanocores 45a' to stable planes. In particular, according to example embodiments of the present disclosure, since the nanocores 45a' are grown on the openings O having tapered sidewalls, the nanocores 45a' may have tapered sidewalls corresponding thereto. However, as illustrated in FIG. 13D, nanocores 45a after the heat treatment process or the re-growth process may have almost uniform diameters (or widths) due to re-arrangement and re-growth of crystals thereof. In addition, even though the tips of the nanocores 45a' just after the growth have an imperfect hexagonal pyramid shape, tips of the nanocores 45a after the heat treatment process or the re-growth process may be changed to have the shape of a hexagonal pyramid having uniform surfaces. Accordingly, the nanocores 45a' having non-uniform widths after the mask 43 is removed may have the shape of a hexagonal pyramid pillar structure having uniform widths through the heat treatment process or the re-growth process.

A thickness of active layers, that is, a thickness of quantum wells may be controlled by changing a pitch between nanocores related to arrangement distance of the nanocores in a device. Through such a thickness control, active layers emitting light having different emission wavelengths may be implemented in a single device using the same growth process.

Figure 14:
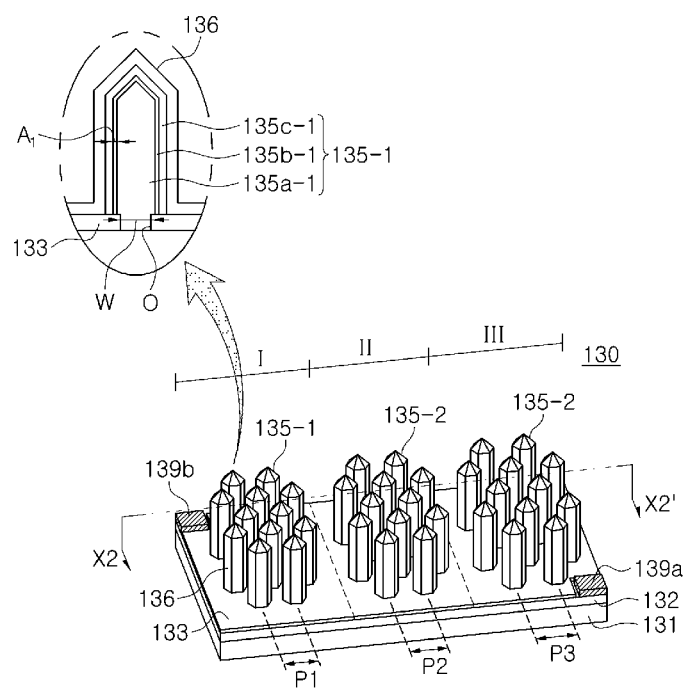
FIG. 14 is a schematic perspective view illustrating a nanostructure semiconductor light-emitting device according to an example embodiment of the present disclosure.

A nanostructure semiconductor light-emitting device 130 illustrated in FIG. 14 may include a base layer 132 formed of a first conductivity-type semiconductor material, and a plurality of light-emitting nanostructures 135-1, 135-2, and 135-3 disposed on the base layer 132.

The nanostructure semiconductor light-emitting device 130 may include a substrate 131 having an upper surface on which the base layer 132 is disposed. The substrate 131 may be an insulating, a conductive, or a semiconductor substrate. For example, the substrate 131 may include sapphire, SiC, Si, $MgAl_2O_4$, MgO, $LiAlO_2$, $LiGaO_2$, or GaN.

The base layer 132 may provide a growth plane for light-emitting nanostructures the light-emitting nanostructures 135-1, 135-2, and 135-3. The base layer 132 may be a nitride semiconductor satisfy $Al_xIn_yGa_{1-x-y}N$ ($0 \leq x < 1$, $0 \leq y < 1$, and $0 \leq x+y < 1$), and may be doped with specific conductivity-type impurities. For example, the base layer 132 may be GaN doped with n-type impurities such as Si.

Figure 15:
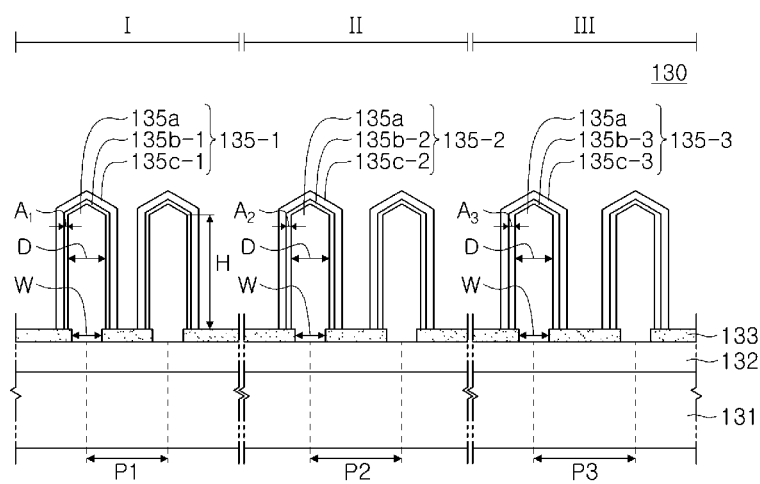
FIG. 15 is a cross-sectional view taken along line X2-X2' of the nanostructure semiconductor light-emitting device illustrated in FIG. 1.
Figure 16:
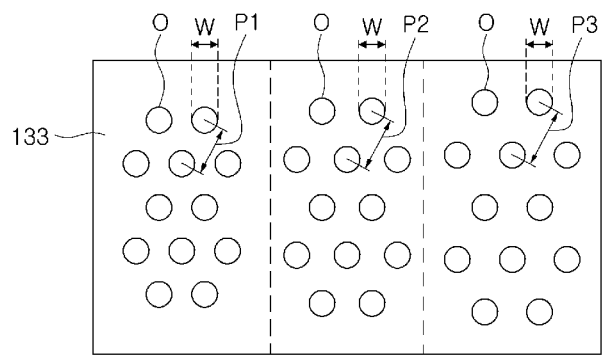
FIG. 16 is a plan view illustrating patterns of openings in the mask of FIG. 14 according to an example embodiment of the present disclosure.

As illustrated in FIG. 15, the insulating layer 133 may have a plurality of openings O configured to grow nanocores 135a. The insulating layer 133 may be an insulating material, such as $SiO_2$ or $SiN_x$, capable of being used in a semiconductor process. FIG. 16 illustrates an insulating layer 133 as a mask according to an example embodiment of the present disclosure. In the insulating layer 133, openings O having the same width W may be arranged to have different pitches (P1<P2<P3) throughout the first to third regions I, II, and III.

The light-emitting nanostructures 135-1, 135-2, and 135-3 may include nanocores 135a formed of a first conductivity-type semiconductor material, active layers 135b-1, 135b-2, and 135b-3 and second conductive-type semiconductor layers 135c-1, 135c-2, and 135c-3 sequentially formed on surfaces of the nanocores 135a-1, 135a-2, and 135a-3.

The nanocores 135a may be arranged at different pitches ($P_1 < P_2 < P_3$) respectively in different regions I, II, and III, however, have the same size (in particular, the same diameter D). When the nanocores 135a are grown using the insulating layer 133 illustrated in FIG. 16 as a mold mask (please refer to FIGS. 18B and 18C), the nanocores 135a in different groups may have almost the same diameter D since they are grown using the openings O having the same width W even if the pitches are different (P1<P2<P3) (however, in some cases, differences in heights may exist). The nanocores 135a may be a nitride semiconductor material satisfying $Al_xIn_yGa_{1-x-y}N$ ($0 \leq x < 1$, $0 \leq y < 1$, and $0 \leq x+y < 1$), similarly to the base layer 132. For example, the nanocores 135a may be n-type GaN.

The active layers 135b-1, 135b-2, and 135b-3 may have an MQW structure in which a plurality of quantum wells and a plurality of quantum barriers are alternately stacked. For example, the active layers 135b-1, 135b-2, and 135b-3 may have a GaN/InGaN MQW structure. On the other hand, the active layers 135b-1, 135b-2, and 135b-3 may have a SQW structure.

The light-emitting nanostructures 135-1, 135-2, and 135-3 according to example embodiments of the present disclosure may be divided into three groups (first to third groups) according to the pitches of P1, P2, and P3.

The light-emitting nanostructures 135-1, 135-2, and 135-3 of the first to third groups may be respectively disposed in three regions I, II, and III formed by dividing an upper surface of the base layer 132. The three regions I, II, and III are exemplarily illustrated as being arranged side by side, but is not limited thereto. The three regions I, II, and III may be implemented in various arrangements and various areas.

The active layers 135b-1, 135b-2, and 135b-3 belonging to different groups may include quantum wells having different thicknesses to emit light having different wavelengths. Normally, the thickness of the quantum wells may be controlled by conditions of a growth process (a temperature, a pressure, a flux of a source, or the like). However, according to example embodiments of the present disclosure, the quantum wells having different thicknesses may be obtained using pitches at the same conditions of the growth process. According to example embodiments of the present disclosure, even when the active layers 135b-1, 135b-2, and 135b-3 (in particular, the quantum well) grow on the nanocores 135a under the same growth conditions for all groups, the active layers 135b-1, 135b-2, and 135b-3 may be grown to have different thicknesses ($A_1<A_2<A_3$) in different regions I, II, and III with different pitches P1, P2, and P3. Thus, the greater the pitch of the nanocores (P1<P2<P3), the greater the thickness of the active layers ($A_1<A_2<A_3$) may be.

Meanwhile, when the thicknesses of the quantum wells vary according to the pitches (P1<P2<P3), a quantum well having a relatively great thickness may have a larger In composition than a quantum well having a relatively small thickness.

Because of such a tendency, the light-emitting nanostructures 135-2 belonging to the second group may emit light having a long wavelength than the light-emitting nanostructures 135-1 belonging to the first group, and the light-emitting nanostructures 135-3 belonging to the third group may emit light having a long wavelength than the light-emitting nanostructures 135-2 belonging to the second group. Likewise, a multi-wavelength light-emitting device emitting light having different wavelengths in different groups may be implemented. Furthermore, such a multi-wavelength light-emitting device may be implemented as a white light-emitting device. For example, the active layers 135b-1, 135b-2, and 135b-3 belonging to the first to third groups may be designed to emit light of blue, green, and red bands, respectively. an emission wavelength of the active layers 135b-1 belonging to the first group may in the range of about 430 nm to about 480 nm, an emission wavelength of the active layers 135b-2 belonging to the second group may in the range of about 480 nm to about 540 nm, and an emission wavelength of the active layers 135b-3 belonging to the third group may in the range of about 570 nm to about 630 nm.

The second conductive-type semiconductor layers 135c-1, 135c-2, and 135c-3 may be a nitride semiconductor material satisfying p-type $Al_xIn_yGa_{1-x-y}N$ ($0 \leq x<1$, $0 \leq y<1$, and $0 \leq x+y<1$). In some embodiments, the second conductive-type semiconductor layers 135c-1, 135c-2, and 135c-3 may include a p-type AlGaN EBL and a p-type GaN layer. The second conductive-type semiconductor layers 135c-1, 135c-2, and 135c-3 may have different thicknesses in different regions I, II, and III due to the difference in pitches (P1<P2<P3).

In example embodiments of the present disclosure, nanocores 135a belonging to at least one of the three groups may have a difficult condition to ensure film thickness uniformity. That is, when the height of the nanocores 135a and a pitch between the nanocores 135a are represented as H (μm) and P (μm), respectively, $H^2/P \geq 2.35$ may be satisfied. The film thickness uniformity of 80% or more and even 90% or more may be implemented by controlling at least one process parameter of a flux of a source, a flow rate of the source, a chamber pressure, a growth temperature, and a growth rate. More specifically, at least one of the active layers 135b-1, 135b-2, and 135b-3 and the second conductive-type semiconductor layers 135c-1, 135c-2, and 135c-3 may have a film thickness uniformity of 80% or more and even 90% or more. Through this, problems such as wavelength scattering in active layers and current crowding due to non-uniform thicknesses of second conductive-type semiconductor layers may be effectively solved, and light-emitting efficiency may be significantly improved.

A contact electrode 136 according to example embodiments of the present disclosure may be formed of an ohmic contact material capable of forming an ohmic contact with the second conductive-type semiconductor layers 135c. For example, the contact electrode 136 may include at least one of Ag, Ni, Al, Rh, Pd, Ir, Ru, Mg, Zn, Pt, and Au, and have a single-layered structure or a multilayered structure. The contact electrode 136 may be formed of a transparent conductive material. The contact electrode 136 may be, but is not limited to, one of transparent conductive oxide layer and nitride layer.

The nanostructure semiconductor light-emitting device 130 may include a first electrode 139a and a second electrode 139b. The first electrode 139a may be disposed on an area in which a portion of the base layer 132 is exposed. In addition, the second electrode 139b may be formed on an area in which the contact electrode 136 extends to be exposed.

In the above-described example embodiments, it is described that thicknesses of active layers, that is, the thicknesses of quantum wells are controlled by varying pitches between the nanocores. In contrast to the above-described embodiments, active layers having different emission wavelengths may be obtained through the same growth process by varying a parameter related to the size of the nanocores, that is, one of diameters and heights of the nanocores or by varying pitches together therewith.

A nanostructure semiconductor light-emitting device 150 illustrated in FIG. 17 may include, similarly to example embodiments described with reference to FIG. 14, a base layer 152 formed of a first conductivity-type semiconductor material, and plurality of light-emitting nanostructures 155-1, 155-2, and 155-3 disposed on the base layer 152.

The nanostructure semiconductor light-emitting device 150 may include a substrate 151 having an upper surface on which the base layer 152 is disposed. The base layer 152 may provide a growth plane of the light-emitting nanostructures 155-1, 155-2, and 155-3. The insulating layer 153 may include a plurality of openings O1, O2, and O3 for growing nanocores 155a-1, 155a-2, and 155a-3. According to example embodiments of the present disclosure, the plurality of openings O1, O2, and O3 may have different widths ($W_1>W_2>W_3$) in different groups.

The light-emitting nanostructures 155-1, 155-2, and 155-3 according to example embodiments of the present disclosure may be divided into three groups (first to third groups) according to sizes of the nanocores 155a-1, 155a-2, and 155a-3. The light-emitting nanostructures 155-1, 155-2, and 155-3 belonging to the first to third groups may be respectively disposed in three regions I, II, and III formed by dividing an upper surface of the base layer 152.

Figure 17:
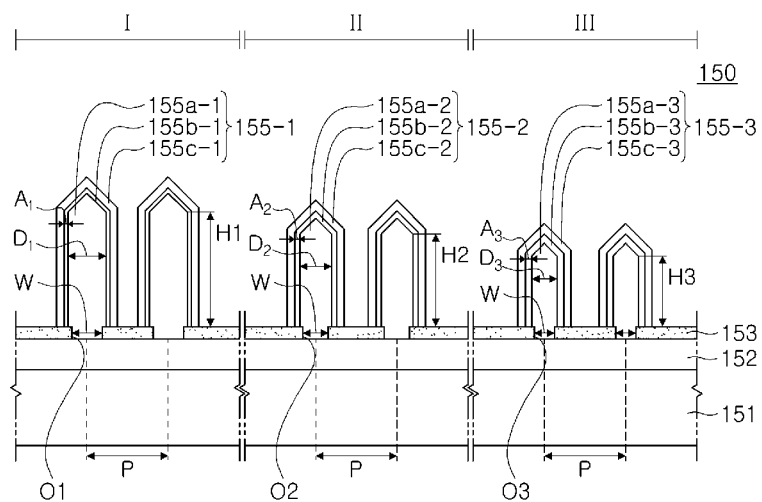
FIG. 17 is a cross-sectional view of a nanostructure semiconductor light-emitting device according to an example embodiment of the present disclosure.

As illustrated in FIG. 17, the nanocores 155a-1, 155a-2, and 155a-3 belonging to the first to third groups may have different diameters ($D_1>D_2>D_3$) and different heights ($H_1>H_2>H_3$).

When a height of the nanocores and a pitch between the nanocores belonging to at least one of the three groups are represented as H (μm) and P (μm), respectively, $H^2/P \geq 2.35$ may be satisfied.

Active layers 155b-1, 155b-2, and 155b-3 and second conductive-type semiconductor layers 155c-1, 155c-2, and 155c-3 may be formed on surfaces of the nanocores 155a-1, 155a-2, and 155a-3 belonging to different groups. At least one of the active layers and the second conductive-type semiconductor layers belonging to different groups, or portions thereof may be formed to have a film thickness uniformity of 80% or more and even 90% or more. Such a film thickness uniformity may be obtained by controlling at least one process parameter of a flux of a source, a flow rate of the source, a chamber pressure, a growth temperature, and a growth rate (refer to FIG. 4 and a description related thereto). In this regard, unless described otherwise, a context described in the above example embodiments may be combined with example embodiments of the present disclosure.

According to an example embodiment of the present disclosure, the active layers 155b-1, 155b-2, and 155b-3 belonging to different groups may have different thicknesses of quantum wells so as to emit light having different wavelengths. As illustrated in FIG. 17, the quantum wells may be grown to have different thicknesses even in the same growth process, by varying diameters $D_n$ and heights $H_n$ of the nanocores 155a-1, 155a-2, and 155a-3 belonging to different groups. The greater the diameters and the heights of the nanocores 155a-1, 155a-2, and 155a-3, the smaller the thicknesses of the active layers 155b-1, 155b-2, and 155b-3s respectively grown on the surfaces of the nanocores 155a-1, 155a-2, and 155a-3 may be. For example, a thickness of the active layers 155b-2 belonging to the second group may be greater than a thickness of quantum wells of the active layers 155b-1 belonging to the first group, and smaller than a thickness of quantum wells of the active layers 155b-3 belonging to the third group.

In this manner, similarly to the above-described embodiment in which pitches are controlled, the active layers 155b-1, 155b-2, and 155b-3 belonging to different groups may include quantum wells having different thicknesses and different In compositions even when grown in the same growth process. As a result, the active layers 155b-1, 155b-2, and 155b-3 belonging to different groups may emit light having different wavelengths, and the nanostructure semiconductor light-emitting device 150 may finally provide white light by combining thereof.

FIGS. 18A to 18G are cross-sectional views illustrating main processes of a method of manufacturing nanostructure semiconductor light-emitting device illustrated in FIG. 14.

Figure 18A:
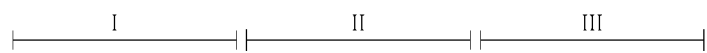
FIGS. 18A to 18G are cross-sectional views illustrating main processes of a method of manufacturing a nanostructure semiconductor light-emitting device according to an example embodiment of the present disclosure.

As illustrated in FIG. 18A, a base layer 132 may be provided by growing a first conductivity-type semiconductor material on a substrate 131.

The base layer 132 may include an upper surface divided into first to third regions I, II, and III, and a plurality of light-emitting nanostructures emitting light having different wavelengths may be disposed in the first to third regions I, II, and III. According to example embodiments of the present disclosure, the light-emitting nanostructures may be formed by controlling pitches of the nanocores. Different regions may be provided to have different areas or different shapes in consideration of light-emitting efficiency or the number of distribution of the light-emitting nanostructures of each group so that white light is obtained.

Figure 18B:
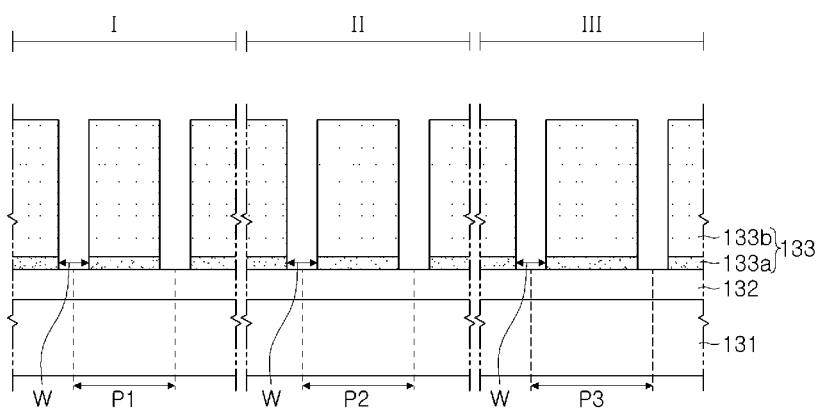

Next, as illustrated in FIG. 18B, a mask 133 including a plurality of openings O and including an etch-stop layer may be formed on the base layer 132.

The mask 133 according to example embodiments of the present disclosure may include a first material layer 133a formed on the base layer 132, and a second material layer 133b formed on the first material layer 133a and having an etch rate greater than an etch rate of the first material layer 133a. The first material layer 133a may be provided as the etch-stop layer. That is, the first material layer 133a may have a lower etch rate than the second material layer 133b under conditions of etching the second material layer 133b. At least the first material layer 133a may be an electrically insulating material and, as necessary, the second material layer 133b may also be an insulating material.

The insulating layer 133 may include openings O having the same width W and different pitches (P1<P2<P3) throughout the first to third regions I, II, and III. For example, the openings O in the first region I may be arranged in a first pitch P1, and the openings O in the second region II may be arranged in a second pitch P2 greater than the first pitch P1. In addition, the openings O in the third region III may be arranged in a third pitch P3 greater than the second pitch P2.

Figure 18C:
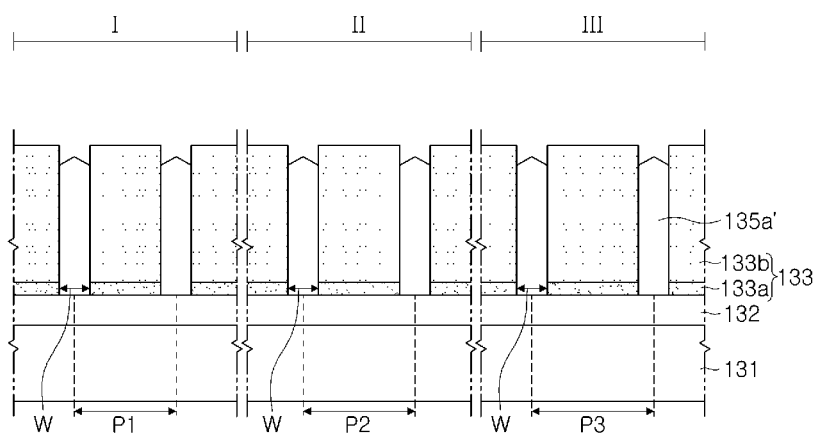

Next, as illustrated in FIG. 18C, a plurality of nanocores 135a' may be formed by growing a first conductivity-type semiconductor material on exposed portions of the base layer 132 to fill the openings O in each group.

The first conductivity-type semiconductor material of the nanocores 135a' may be an n-type nitride semiconductor material, and the same material as the first conductivity-type semiconductor material of the base layer 132. For example, the base layer 132 and the nanocores 135a' may be formed of n-type GaN.

Single crystalline nitride including the nanocores 135a may be formed in an MOCVD or MBE process, and the mask 133 may function as a mold for the single crystalline nitride to be grown, and thus nanocores 135a corresponding to shapes of the openings O may be provided. That is, the single crystalline nitride may be selectively grown on the base layer 132 exposed in the openings O by the mask 133 and fill the openings O. The single crystalline nitride filling the openings O may have a shape corresponding to the shape of the openings O. Accordingly, the nanocores 135a' formed in different groups may have the same size (the same diameter and height) even though arranged in different pitches (P1<P2<P3).

According to example embodiments of the present disclosure, the height and arrangement density of the nanocores 135a' may be designed to ensure a large light-emitting area. The nanocores 135a' belonging to at least one of the three groups may be formed such that the height H and pitch P thereof satisfy $H^2/P \geq 2.35$.

Figure 18D:
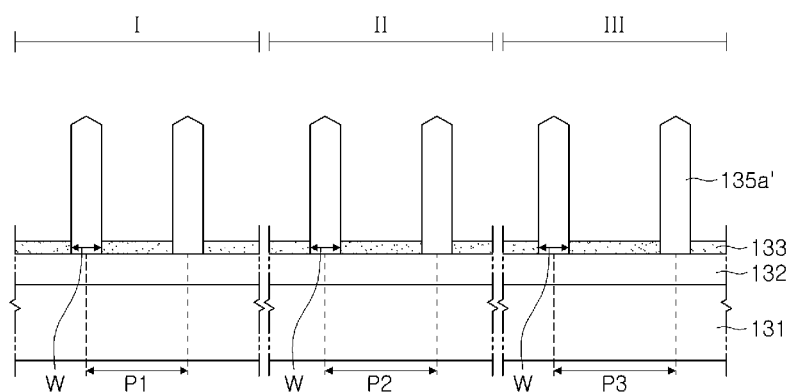

Next, as illustrated in FIG. 18D, the mask 133 may be removed to the first material layer 133a, that is, the etch-stop layer, to partially expose side surfaces of the plurality of nanocores 135a'.

According to example embodiments of the present disclosure, since an etching process in which the second material layer 133b is selectively removed is applied, only the second material layer 133b may be removed and the first material layer 133a may remain. The remaining first material layer 133a may reduce or prevent the active layers 135b and the second conductive-type semiconductor layers 135c from being in contact with the base layer 132 in a subsequent growth process.

Figure 18E:
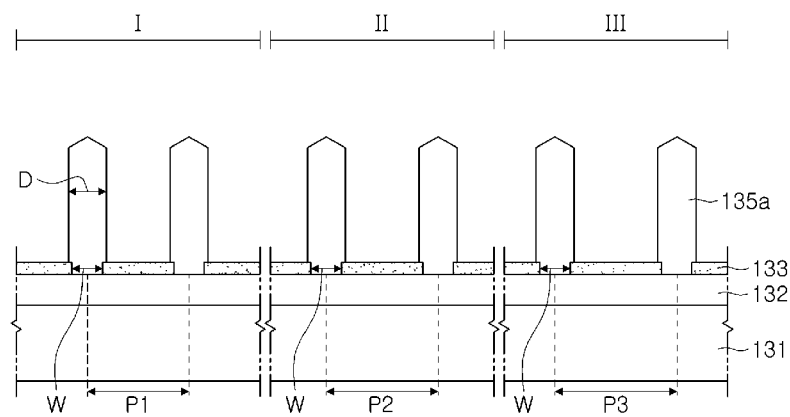

Next, as illustrated in FIG. 18E, after the growth of nanocores 135a is completed and the upper layer (the second material layer 133b) of the mask 133 is removed, the unstable crystal planes of the nanocores 135a may be converted into a stable crystal planes, such as semi-polar or non-polar crystal planes, advantageous for crystal growth, by performing a heat treatment or a re-growth process on surfaces of the nanocores 135a in a certain condition. Such a process may be described with reference to FIGS. 12A and 12B.

Figure 18F:
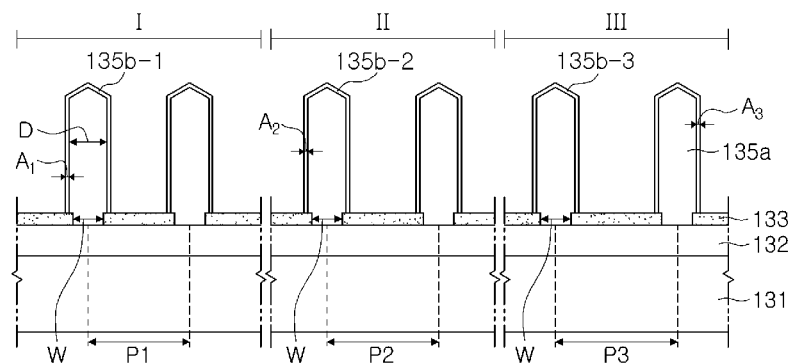

Next, as illustrated in FIG. 18F, active layers 135b-1, 135b-2, and 135b-3 may be formed on the plurality of nanocores 135a.

The process may be performed on the nanocores 135a disposed in different regions I, II, and III under the same conditions. That is, the process may be performed by supplying the same flux of source in the same chamber under the same temperature and pressure conditions. Since the pitches of the nanocores 135a are different in different regions I, II, and III despite the same process conditions, layers grown on surfaces of the nanocores 135a, in particular, the active layers 135b-1, 135b-2, and 135b-3 may have different thicknesses ($A_1 < A_2 < A_3$) in different regions I, II, and III. The active layers 135b-1, 135b-2, and 135b-3 according to example embodiments of the present disclosure may have an MQW structure in which a plurality of quantum wells and a plurality of quantum barriers are alternately stacked. As described above, since the thicknesses of the quantum wells in different regions I, II, and III are varied, compositions (e.g. In composition ratio) of the quantum wells may be varied. As a result, the active layers 135b-1, 135b-2, and 135b-3 obtained in different regions I, II, and III may emit light having different wavelengths. At least one of the quantum wells and the quantum barriers may be formed to have a film thickness uniformity of 80% or more and even 90% or more, by controlling at least one process parameter of a flux of a source, a flow rate of the source, a chamber pressure, a growth temperature, and a growth rate. Peak wavelengths of light emitted from different areas of the active layers 135b-1, 135b-2, and 135b-3 may have variation of 3 nm or less. In order to ensure the film thickness uniformity, a growth temperature may be controlled to be 1000° C. or more during a process of growing the quantum barriers. A flux of $NH_3$ may be controlled to be 18000 sccm or more during a process of growing the quantum wells and/or a process of growing the quantum barriers. A growth rate may be controlled to obtain preferred or desired film thickness uniformity. During the process of growing the quantum wells, the growth rate thereof may be controlled to be 0.006 nm/sec or less.

Figure 18G:
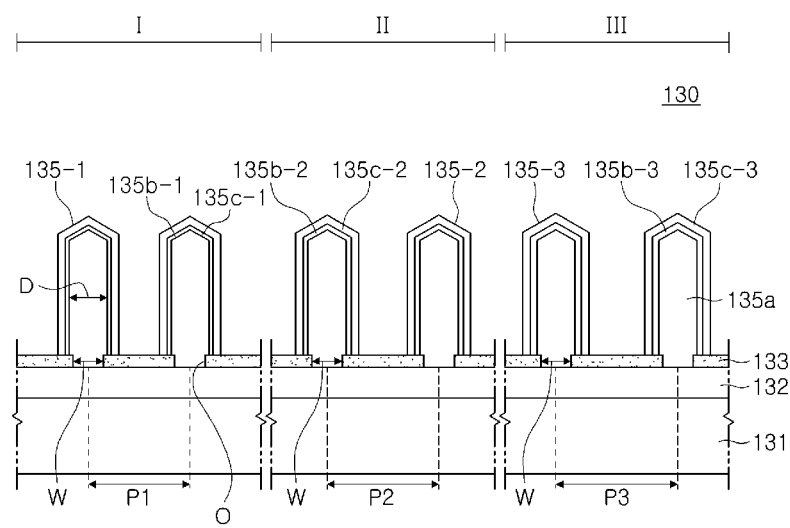

Next, as illustrated in FIG. 18G, second conductive-type semiconductor layers 135c-1, 135c-2, and 135c-3 may be grown on the active layers 135b-1, 135b-2, and 135b-3.

Through the process, the light-emitting nanostructures 135 may have a multilayer shell surrounding the nanocores 135a formed of the first conductivity-type semiconductor material. The second conductive-type semiconductor layers 135c-1, 135c-2, and 135c-3 may include a nitride semiconductor material satisfying p-type $Al_xIn_yGa_{1-x-y}N$ ($0 \leq x < 1$, $0 \leq y < 1$, and $0 \leq x+y < 1$). As necessary, the second conductive-type semiconductor layers 135c-1, 135c-2, and 135c-3 may be formed of a plurality of layers. Each of the second conductive-type semiconductor layers 135c-1, 135c-2, and 135c-3 may include an Al-containing EBL and a p-type GaN layer.

The second conductive-type nitride semiconductor layers 135c-1, 135c-2, and 135c-3 may be formed to have a film thickness uniformity of 80% or more and even 90% or more, by controlling at least one process parameter of a flux of a source, a flow rate of the source, a chamber pressure, a growth temperature, and a growth rate. During the process of growing the Al-containing EBL, a growth temperature thereof may be controlled to be 1050° C. or more. During the process of growing the Al-containing EBL, a growth rate thereof may be controlled to be 0.0 μm/hr or more (e.g. a flux of TMGa is 50 sccm or more).

Experiment 1A: Active Layers (Quantum Barriers)/Control of Growth Temperature

Nanocores having sizes (heights: about 3 μm) and pitches satisfying the conditions of generating variations in thickness were formed, and GaN quantum barriers were grown under the same conditions, except for the growth temperature. The growth temperature of the quantum barriers was 1020° C. for a standard sample R1 and 1070° C. for another sample E1.

Figure 19:
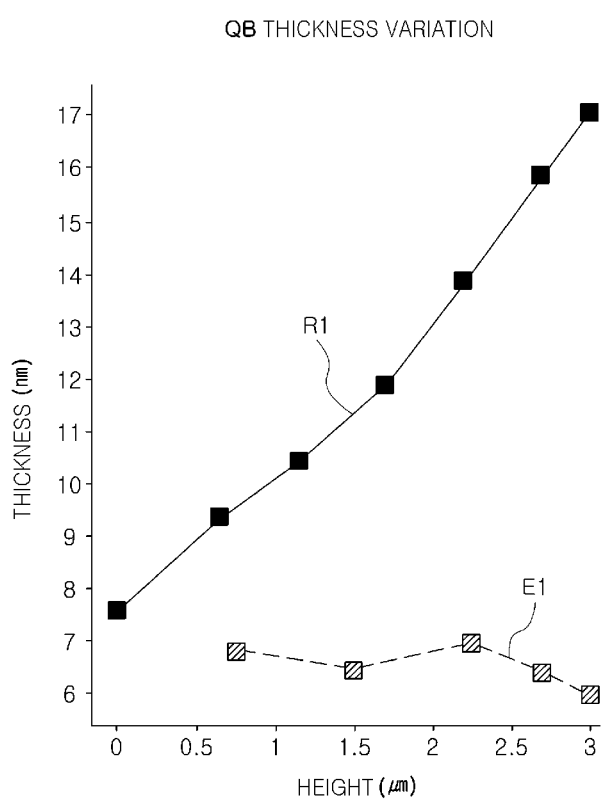
FIG. 19 is a graph illustrating results of Experiment 1A (control of a growth temperature), variations in thicknesses of quantum barriers.

Upper and lower thicknesses of the quantum barriers grown in each sample were measured, and the film thickness variation and film thickness uniformity thereof were calculated. The results are listed in Table 3 and illustrated in FIG. 19.

TABLE 3

| Samples | Maximum Thickness (nm) | Minimum Thickness (nm) | Film Thickness Variation (%) | Film Thickness Uniformity (%) |
|---|---|---|---|---|
| R1 | 17 | 7.6 | 55 | 45 |
| E1 | 6.8 | 6.0 | 12 | 88 |

As shown in the results, the film thickness uniformity was significantly improved to be 88% by increasing the growth temperature of the quantum barriers by 50° C. during the growth process thereof. It is understood that migration of a source increases according to increases in temperature.

Experiment 1B: Active Layers/Control of Flux and Pressure of $NH_3$

Nanocores having sizes (heights: about 3 μm) and pitches satisfying the conditions of generating variations in thickness were formed, and GaN quantum barriers and InGaN quantum wells were grown under the same conditions, except for the flux and pressure of $NH_3$.

The flux and pressure of $NH_3$ of a standard sample R2 were set to be 200 mbar and 1800 sccm, respectively. The flux and pressure of $NH_3$ of a first sample E21 were set to be 100 mbar and 18000 sccm, respectively, the flux and pressure of $NH_3$ of a second sample E22 were set to be 100 mbar and 21000 sccm, respectively, and the flux and pressure of $NH_3$ of a third sample E23 were set to be 100 mbar and 25000 sccm, respectively.

Figure 20A:
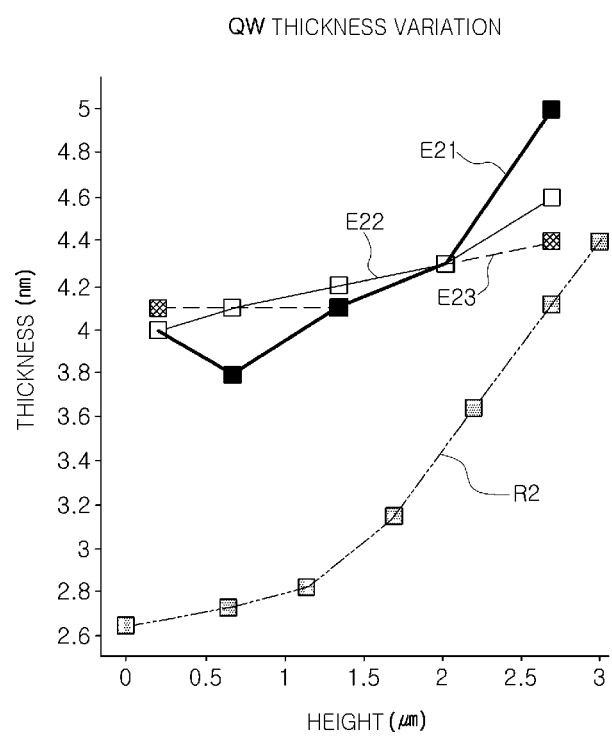
FIGS. 20A and 20B are graphs illustrating results of Experiment 1B (control of a flux), variations in thicknesses of quantum wells and quantum barriers, respectively.

Upper and lower thicknesses of the quantum wells for the standard sample and the first to third samples were measured, and the film thickness variation and film thickness uniformity thereof were calculated. The results are listed in Table 4 and illustrated in FIG. 20A.

TABLE 4

| Samples | Upper Thickness (nm) | Lower Thickness (nm) | Film Thickness Variation (%) | Film Thickness Uniformity (%) |
|---|---|---|---|---|
| R2 | 5.3 | 2.0 | 37 | 63 |
| E21 | 5.0 | 3.8 | 24 | 76 |
| E22 | 4.6 | 4.0 | 13 | 87 |
| E23 | 4.4 | 4.1 | 7 | 93 |

Figure 20B:
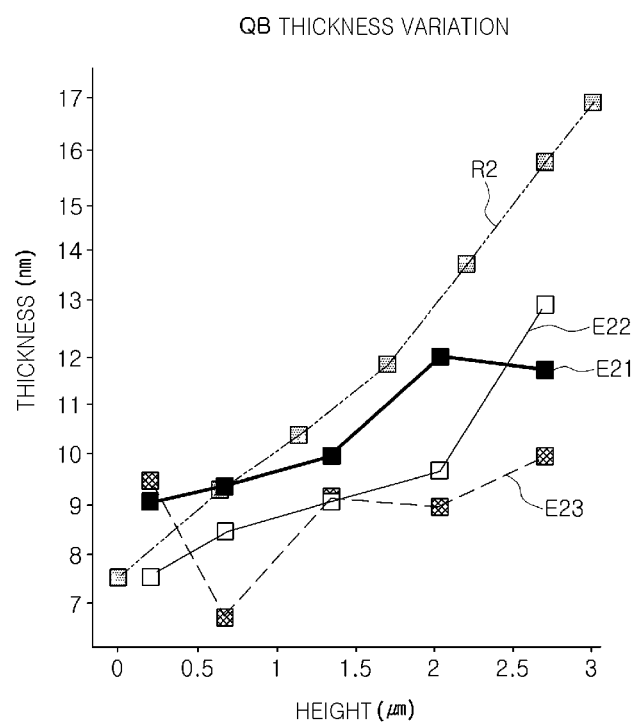

Upper and lower thicknesses of the quantum barriers for the standard sample and the first to third samples were measured, and the film thickness variation and film thickness uniformity thereof were calculated. The results are listed in Table 5 and illustrated in FIG. 20B.

TABLE 5

| Samples | Upper Thickness (nm) | Lower Thickness (nm) | Film Thickness Variation (%) | Film Thickness Uniformity (%) |
|---|---|---|---|---|
| R2 | 16.0 | 8.0 | 50 | 50 |
| E21 | 15.7 | 9.0 | 43 | 57 |
| E22 | 12.5 | 7.7 | 38 | 62 |
| E23 | 8.2 | 7.0 | 15 | 85 |

As shown in the results, the film thickness uniformity (QW: 87% and 93%, QB: 85%) was significantly improved by increasing the flux of $NH_3$ during the process of growing the quantum wells and the quantum barriers. It is understood that direct diffusion of a source increases according to increases in flux of the source.

Experiment 1C: Active Layers (Quantum Wells)/Control of Growth Rate

Nanocores having sizes (heights: about 3 μm) and pitches satisfying the conditions of generating variations in thickness were formed, and InGaN quantum wells were grown under the same conditions, except for the growth rate. The growth rate was set to be varied by controlling a flux of a group III source.

Figure 21:
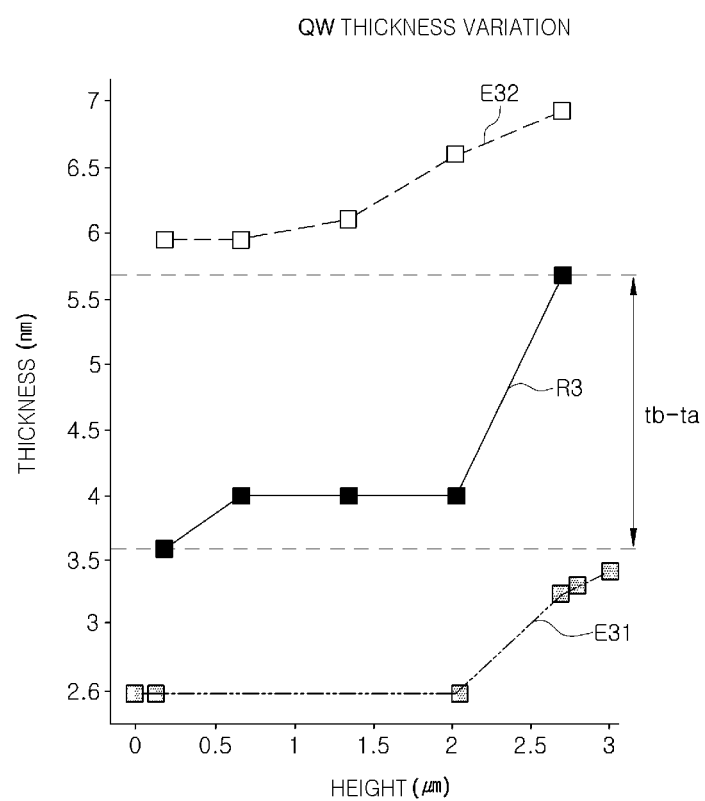
FIG. 21 is a graph illustrating results of Experiment 1C (control of a flow rate), variations in thicknesses of quantum wells.

A growth rate of a standard sample R3 was about 0.006 nm/sec. A growth rate of a first sample E31 was set to be lower than the growth rate of the standard sample, and a growth rate of a second sample E32 was set to be higher than the growth rate of the standard sample Upper and lower thicknesses of the quantum wells for each sample were measured, and the film thickness variation and film thickness uniformity thereof were calculated. The results are listed in Table 6 and illustrated in FIG. 21.

TABLE 6

| Samples | Upper Thickness (nm) | Lower Thickness (nm) | Film Thickness Variation (%) | Film Thickness Uniformity (%) |
|---|---|---|---|---|
| R3 | 3.4 | 2.5 | 27 | 73 |
| E31 | 7.0 | 6.0 | 14 | 86 |
| E32 | 5.7 | 3.6 | 37 | 63 |

As shown in the results, the film thickness uniformity was significantly improved to be 86% by decreasing the growth rate during the process of growing the quantum wells. It is understood that a collision velocity is decreased by reducing the growth rate.

Experiment 2A: P-Type GaN Layer/Control of Growth Temperature

Similar to the structure illustrated in FIGS. 14 and 15, nanocores having a size (heights: about 2.7 μm) and pitches of about 1.1 μm, 1.5 μm, and 2.0 μm respectively for three groups were formed, then active layers (having different thicknesses and different emission wavelengths by group) were formed in the same conditions, and then p-type GaN was grown under the same conditions, except for the growth temperature.

The growth temperature of the p-type GaN was set to be 980° C. for a standard sample R4, and 1030° C. and 1080° C. respectively for two samples.

Upper and lower thicknesses of the p-type GaN for each group of each sample were measured and the film thickness variations thereof were calculated. The results are listed in Table 7.

TABLE 7

| Samples | Variation in First Group (%) | Variation in Second Group (%) | Variation in Third Group (%) |
|---|---|---|---|
| R4 | 12 | 16 | 18 |
| E41 | 2 | 3 | 15 |
| E42 | 1 | 1 | 2 |

As shown in the results, the film thickness variation was significantly improved in the third group having the greatest pitch by increasing the growth temperature of the p-type GaN during the process of growing thereof. It is understood that direct diffusion increases since a flow rate of a source increases.

Experiment 2B: P-Type GaN Layer/Control of Growth Rate (Group III Source Flux)

Similarly to the Experiment 2A, a standard sample R5 and two samples E51 and E52 formed by changing the flux of a group III source from the standard sample R5 were fabricated. That is, the flux of TMGa was changed in each sample during the growth of p-type GaN. The flux of TMGa was set to be 67 sccm for 30 minutes for the standard sample R5, and 48 sccm for 40 minutes and 32 sccm for 60 minutes respectively for two samples E51 and E52.

Upper and lower thicknesses of the p-type GaN for the standard sample R5 and two samples E51 and E52 were measured and the film thickness variations thereof were calculated. The results are listed in Table 8.

TABLE 8

| Samples | Variation in First Group (%) | Variation in Second Group (%) | Variation in Third Group (%) |
|---|---|---|---|
| R5 | 13 | 4 | 10 |
| E51 | 8 | 10 | 7 |
| E52 | 1 | 10 | 5 |

As shown in the results, the film thickness variation was reduced by reducing the flux of the group III source during the growth of the p-type GaN and thereby reducing the growth rate thereof. It is understood that the film thickness variation is reduced by reducing a collision velocity.

Experiment 2C: Electron Blocking Layer/Introduction of Superlattice Structure As a standard sample R6, active layers were formed on m planes of the nanocores, and p-type AlGaN as an EBL and p-type GaN as a contact layer were formed. Another sample E6 was formed to be the same as the standard sample R6 except that the EBL had a superlattice structure including four pairs of AlGaN/GaN (refer to FIG. 9A).

In the samples R6 and E6, film thickness uniformity, Al-composition uniformity, a forward bias voltage $V_F$ (65 mA) according to measurement points (an upper portion/a lower portion), and a reverse bias leakage current $I_R$ (5 V) according to measurement points (an upper portion/a lower portion were measured, and the results were listed in Table 9.

TABLE 9

| Classification | film thickness uniformity | Al-composition Uniformity | Forward Bias Voltage | Reverse Bias Leakage Current |
|---|---|---|---|---|
| R6 | 60% | 18% | 2.9 V/3.0 V | 100 μA/700 μA |
| E6 | 3% | 16% | 2.8 V/3.0 V | 500 μA/500 μA |

As shown in the results, the film thickness variation and variations in electrical properties according to positions were improved by forming the EBL to have a AlGaN/GaN superlattice structure and perform a function similar to a AlGaN bulk.

Figure 22:
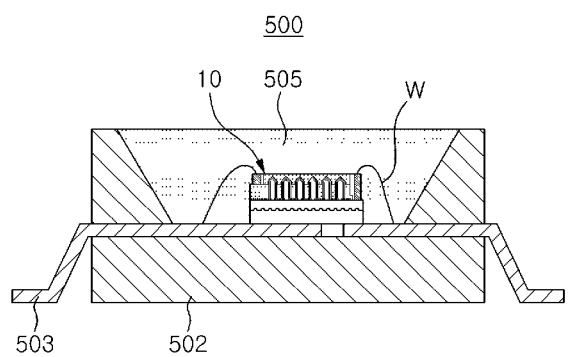
FIG. 22 is a cross-sectional view illustrating a package including the nanostructure semiconductor light-emitting device illustrated in FIG. 1.

The nanostructure semiconductor light-emitting device according to the above-described embodiments of the present disclosure may be implemented in various types of application products. FIG. 22 illustrates an example of a package including the above-described nanostructure semiconductor light-emitting device.

A semiconductor light-emitting device package 500 illustrated in FIG. 22 may include the semiconductor light-emitting device 10 illustrated in FIG. 1, a package body 502, and a pair of lead frames 503.

The nanostructure semiconductor light-emitting device 10 may be mounted on the lead frames 503, and each electrode thereof may be electrically connected to the lead frames 503. As necessary, the nanostructure semiconductor light-emitting device 10 may be mounted on an area other than the lead frames 503, for example, on the package body 502. In addition, the package body 502 may have a cup (U) shape in order to improve reflectance of light, and an encapsulant 505 formed of a light-transmissive material may be formed in the reflective cup in order to encapsulate the semiconductor light-emitting device 10, wires W, and the like.

Figure 23:
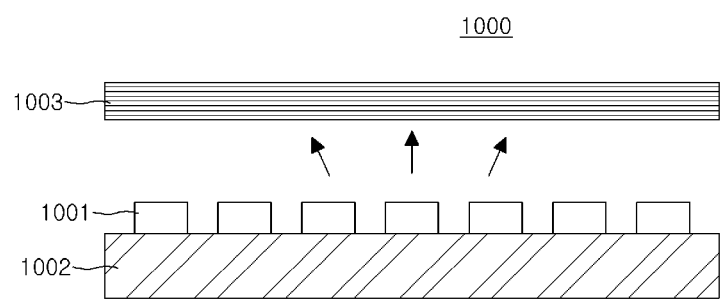
FIGS. 23 and 24 illustrate examples of a backlight unit including a semiconductor light-emitting device according to an example embodiment of the present disclosure.
Figure 24:
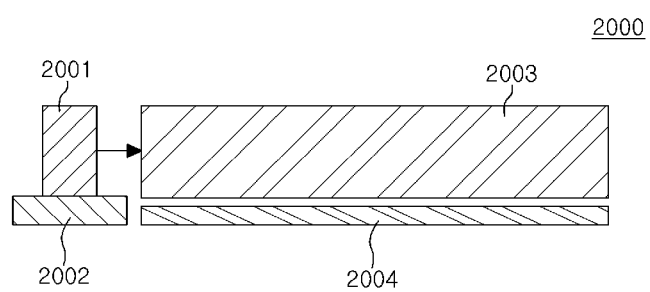

The semiconductor light-emitting device according to the above-described example embodiment of the present disclosure may be usable as a light source in various application products. FIGS. 23 and 24 illustrate examples of various application products including the nanostructure semiconductor light-emitting device.

FIGS. 23 and 24 illustrate examples of a backlight unit including a semiconductor light-emitting device according to an example embodiment of the present disclosure Referring to FIG. 23, a backlight unit 1000 may include a light source 1001 mounted on a substrate 1002, and one or more optical sheets 1003 disposed on the light source 1001. The light source 1001 may include the above-described nanostructure semiconductor light-emitting device or a package including the nanostructure semiconductor light-emitting device.

The light source 1001 in the backlight unit 1000 illustrated in FIG. 23 emits light toward a top surface where a liquid crystal display (LCD) is disposed. On the contrary, in another backlight unit 2000 illustrated in FIG. 24, a light source 2001 mounted on a substrate 2002 emits light in a lateral direction, and the emitted light may be incident to a light guide plate 2003 and converted to the form of surface light. Light passing through the light guide plate 2003 is emitted upwardly, and a reflective layer 2004 may be disposed on a bottom surface of the light guide plate 2003 to improve light extraction efficiency.

Figure 25:
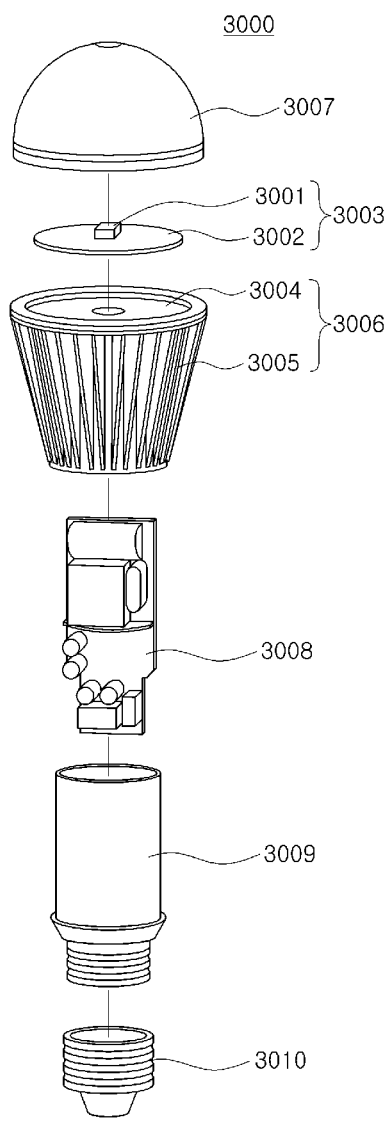
FIG. 25 illustrates an example of an illumination apparatus including a semiconductor light-emitting device according to an example embodiment of the present disclosure.

FIG. 25 is an exploded perspective view illustrating an illumination apparatus including a nanostructure semiconductor light-emitting device according to an example embodiment of the present disclosure.

The illumination apparatus 3000 of FIG. 25 is illustrated as a bulb-type lamp as an example, and includes a light-emitting module 3003, a driving unit 3008, and an external connection portion 3010.

In addition, external structures, such as external and internal housings 3006 and 3009 and a cover 3007, may be further included. The light-emitting module 3003 may include a light source 3001, that is, the above-described semiconductor light-emitting device or a package including the semiconductor light-emitting device, and a circuit board 3002 with the light source 3001 mounted thereon. For example, first and second electrodes of the nanostructure semiconductor light-emitting device may be electrically connected to an electrode pattern of the circuit board 3002. In this example embodiment, a single light source 3001 is mounted on the circuit board 3002, but a plurality of light sources 3001 may be mounted as needed.

The external housing 3006 may function as a heat dissipation unit, and include a heat dissipation plate 3004 in direct contact with the light-emitting module 3003 to enhance a heat dissipation effect, and a heat radiation fin 3005 surrounding side surfaces of the illumination apparatus 3000. The cover 3007 may be installed on the light-emitting module 3003, and have a convex lens shape. The driving unit 3008 may be installed in the internal housing 3009 and connected to the external connection portion 3010, such as a socket structure, to receive power from an external power source.

In addition, the driving unit 3008 may function to convert the power to an appropriate current source capable of driving the light source 3001 of the light-emitting module 3003. For example, the driving unit 3008 may be configured as an AC-DC converter, a rectifying circuit component, or the like.

Figure 26:
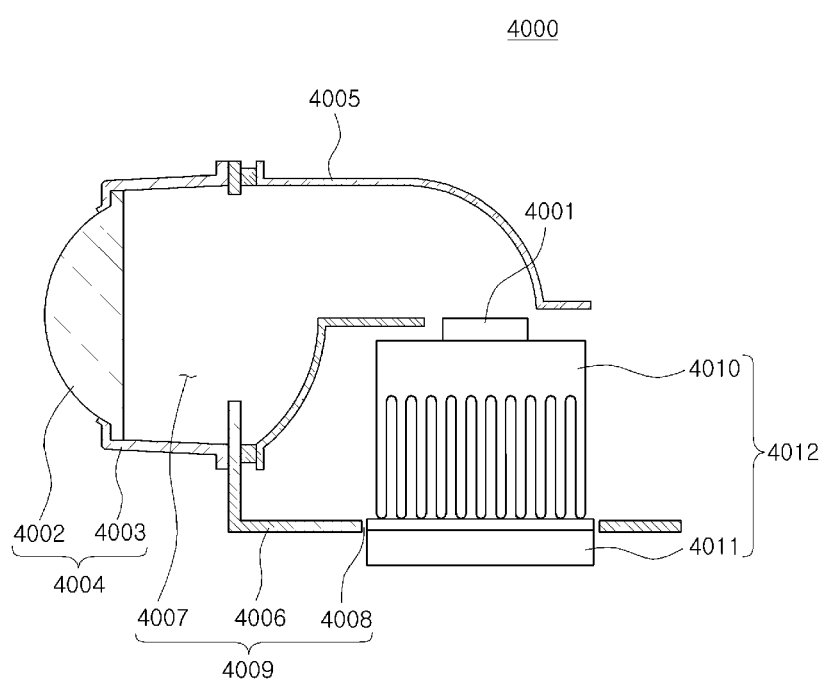
FIG. 26 illustrates an example of a headlamp including a semiconductor light-emitting device according to an example embodiment of the present disclosure.

FIG. 26 illustrates an example in which a nanostructure semiconductor light-emitting device according to an example embodiment of the present disclosure is applied to a headlamp.

Referring to FIG. 26, a headlamp 4000 used as a vehicle lamp, or the like, may include a light source 4001, a reflective unit 4005, and a lens cover unit 4004. The lens cover unit 4004 may include a hollow-type guide 4003 and a lens 4002. The light source 4001 may include the above-described nanostructure semiconductor light-emitting device or a package including the nanostructure semiconductor light-emitting device.

The headlamp 4000 may further include a heat dissipation unit 4012 dissipating heat generated by the light source 4001 outwardly. In order to effectively dissipate heat, the heat dissipation unit 4012 may include a heat sink 4010 and a cooling fan 4011. In addition, the headlamp 4000 may further include a housing 4009 fixedly supporting the heat dissipation unit 4012 and the reflective unit 4005. The housing 4009 may have a central hole 4008 formed in one surface thereof, in which the heat dissipation unit 4012 is coupledly installed.

The housing 4009 may include a front hole 4007 formed on the other surface integrally connected to the one surface and bent in a right angle direction. The front hole 4007 may fix the reflective unit 4005 to be disposed over the light source 4001. Accordingly, a front side of the housing 4009 may be open by the reflective unit 4005. The reflective unit 4005 is fixed to the housing 4009 such that the opened front side corresponds to the front hole 4007, and thereby light reflected by the reflective unit 4005 may pass through the front hole 4007 to be emitted outwardly.

While example embodiments have been shown and described above, it will be apparent to those skilled in the art that modifications and variations could be made without departing from the scope of the present invention as defined by the appended claims.

Additionally, each of the features described above may be combined in any appropriate manner to obtain nanostructure semiconductor light emitting devices, light emitting nanostructures, methods, and/or apparatuses with various combinations of features. In this regard, U.S. application Ser. No. 14/551,978, filed Nov. 24, 2014; Ser. No. 14/723,869, filed May 28, 2015; Ser. No. 13/599,430, filed Aug. 30, 2012; Ser. No. 14/501,232, filed Sep. 30, 2014; U.S. application Ser. No. 14/828,004, filed Aug. 17, 2015; U.S. application Ser. No. 14/833,832, filed Aug. 24, 2015; U.S. application Ser. No. 14/838,322, filed on Aug. 27, 2015; and U.S. application Ser. No. 14/838,635, filed on Aug. 28, 2015 are each hereby incorporated by reference in their entirety, thereby disclosing additional nanostructure semiconductor light emitting devices, light emitting nanostructures, methods, and/or apparatuses with various additional combinations of features.

What is claimed is:

1. A method of manufacturing a nanostructure semiconductor light-emitting device, comprising:
   providing a base layer formed of a first-conductivity type nitride semiconductor material;
   forming nanocores of the first-conductivity type nitride semiconductor material on the base layer spaced apart from each other; and
   forming a multilayer shell including an active layer and a second-conductivity type nitride semiconductor layer on surfaces of each of the nanocores,
   wherein at least a portion of the multilayer shell is formed by controlling at least one process parameter of a flux of a source gas and a flow rate of the source gas so as to have a film thickness uniformity of 80% or more, wherein when a minimum thickness and a maximum thickness of a film grown on side surfaces of each of the nanocores are respectively represented as $t_a$ (nm) and $t_b$ (nm), the film thickness uniformity (%) is defined as $(t_a/t_b) \times 100$.

2. The method of claim 1, wherein when a height of each of the nanocores and a pitch between the nanocores are represented by H (μm) and P (μm), respectively, $H^2/P \geq 2.35$ is satisfied and the film thickness uniformity is 90% or more.

3. The method of claim 1, wherein when a height of each of the nanocores and a pitch between the nanocores are represented by H (μm) and P (μm), respectively, $H^2/P \geq 3.36$ is satisfied.

4. The method of claim 1, wherein peak wavelength of light emitted from the active layer has a variation of 3 nm or less.

5. The method of claim 4, wherein the active layer includes quantum wells and quantum barriers alternately stacked on the surfaces of each of the nanocores.

6. The method of claim 4, wherein the controlling at least one process parameter includes controlling a flux of $NH_3$ to be 18000 sccm or more during growth of the active layer.

7. The method of claim 1, wherein the second-conductivity type nitride semiconductor layer includes an Al-containing electron-blocking layer on the active layer and a p-type contact layer on the electron-blocking layer.

8. The method of claim 7, wherein the controlling at least one process parameter includes controlling at least one process parameter during growth of Al-containing electron-blocking layer.

9. The method of claim 8, wherein the Al-containing electron-blocking layer has a structure in which an Al-containing nitride layer and an Al-free nitride layer are alternately stacked a plurality of times.

10. The method of claim 1, wherein the nanocores are divided into two or more groups having at least one difference in pitches and surface areas of the nanocores and wherein active layers of separate, respective groups of the two or more groups emit light having different wavelengths, respectively.

11. The method of claim 10, wherein the controlling at least one process parameter includes controlling the process parameter such that one group, of the two or more groups, emitting light having a longest wavelength, of the different wavelengths, maintains a film thickness uniformity of 80% or more.

12. The method of claim 11, wherein when a height of each of the nanocores and a pitch between the nanocores are respectively represented by H (μm) and P (μm) in the one group emitting light having the longest wavelength, $H^2/P \geq 3.36$ is satisfied.

13. The method of claim 11, wherein the two or more groups include first, second and third groups, the first group including a first active layer, the second group including a second active layer, the third group including a third active layer, and the first, second and third active layers respectively belonging to the first to third groups emit different colors of light, which are combinable to provide white light.

14. The method of claim 13, wherein the first active layer has an emission wavelength of about 430 nm to about 480 nm, the second active layer has an emission wavelength of about 480 nm to about 540 nm, and the third active layer has an emission wavelength of about 540 nm to about 605 nm.

15. A method of manufacturing a nanostructure semiconductor light-emitting device, comprising:
   forming a plurality of nanocores, wherein when a height of each of the plurality of nanocores and a pitch between the plurality of nanocores are represented by H (μm) and P (μm), respectively, $H^2/P \geq 2.35$ is satisfied; and
   forming a plurality of multi-layer nanocores shells on the plurality of nanocores in accordance with process parameters to obtain a desired process relationship,
   wherein the process parameters include at least one of a flux of a source gas and a flow rate of the source gas.

16. The method of claim 15, wherein the desired process relationship is a film thickness uniformity of 80% or more, wherein when a minimum thickness and a maximum thickness of a film grown on side surfaces of each of the plurality of nanocores are respectively represented as $t_a$ (nm) and $t_b$ (nm), the film thickness uniformity (%) is defined as $(t_a/t_b) \times 100$.

17. The method of claim 16, wherein the film thickness uniformity is 90% or more.

18. The method of claim 15, wherein $H^2/P \geq 3.36$ is satisfied.

19. The method of claim 15, wherein the process parameters includes controlling a flux of $NH_3$ to be 18000 sccm or more during growth of an active layer of the plurality of multi-layer nanocores shells.

* * * * *